(12) United States Patent
Yamazaki et al.

(10) Patent No.: US 9,548,397 B2
(45) Date of Patent: Jan. 17, 2017

(54) SEMICONDUCTOR DEVICE AND METHOD FOR MANUFACTURING THE SAME

(71) Applicant: Semiconductor Energy Laboratory Co., Ltd., Atsugi-shi, Kanagawa-ken (JP)

(72) Inventors: Shunpei Yamazaki, Setagaya (JP); Tatsuya Honda, Isehara (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 14/745,950

(22) Filed: Jun. 22, 2015

(65) Prior Publication Data

US 2015/0287837 A1    Oct. 8, 2015

Related U.S. Application Data

(63) Continuation of application No. 13/488,879, filed on Jun. 5, 2012, now Pat. No. 9,076,874.

(30) Foreign Application Priority Data

Jun. 17, 2011  (JP) .................................. 2011-135365

(51) Int. Cl.
*H01L 21/00* (2006.01)
*H01L 29/786* (2006.01)
(Continued)

(52) U.S. Cl.
CPC ....... *H01L 29/78696* (2013.01); *H01L 29/045* (2013.01); *H01L 29/66969* (2013.01);
(Continued)

(58) Field of Classification Search
CPC ............. H01L 29/78696; H01L 29/045; H01L 29/66969
See application file for complete search history.

(56) References Cited

U.S. PATENT DOCUMENTS 5,528,032 A    6/1996  Uchiyama
5,731,856 A    3/1998  Kim et al.
(Continued)

FOREIGN PATENT DOCUMENTS

EP    1737044 A    12/2006
EP    2226847 A    9/2010
(Continued)

OTHER PUBLICATIONS

Taiwanese Office Action (Application No. 101121110), dated Jan. 25, 2016.
(Continued)

*Primary Examiner* — Laura Menz
(74) *Attorney, Agent, or Firm* — Robinson Intellectual Property Law Office; Eric J. Robinson

(57) ABSTRACT

An object is to provide a structure of a transistor which has a channel formation region formed using an oxide semiconductor and a positive threshold voltage value, which enables a so-called normally-on switching element. The transistor includes an oxide semiconductor stack in which at least a first oxide semiconductor layer and a second oxide semiconductor layer with different energy gaps are stacked and a region containing oxygen in excess of its stoichiometric composition ratio is provided.

12 Claims, 11 Drawing Sheets

(51) Int. Cl.
  *H01L 29/66* (2006.01)
  *H01L 29/04* (2006.01)
  *H01L 21/02* (2006.01)
  *H01L 27/12* (2006.01)

(52) U.S. Cl.
  CPC .... *H01L 29/7869* (2013.01); *H01L 29/78609* (2013.01); *H01L 29/78621* (2013.01); *H01L 21/02554* (2013.01); *H01L 21/02565* (2013.01); *H01L 27/1225* (2013.01)

(56) References Cited

U.S. PATENT DOCUMENTS

| | | |
|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,879,738 B2 | 2/2011 | Wang |
| 7,977,675 B2 | 7/2011 | Kawamura et al. |
| 7,982,250 B2 | 7/2011 | Yamazaki et al. |
| 8,232,551 B2 | 7/2012 | Kim et al. |
| 8,368,066 B2 * | 2/2013 | Yamazaki ............ H01L 27/1225 257/43 |
| 8,497,502 B2 | 7/2013 | Yaegashi |
| 8,502,221 B2 | 8/2013 | Yamazaki |
| 8,633,480 B2 | 1/2014 | Yamazaki et al. |
| 8,659,013 B2 | 2/2014 | Yamazaki |
| 8,692,252 B2 | 4/2014 | Takata et al. |
| 8,748,879 B2 | 6/2014 | Yano et al. |
| 9,076,874 B2 * | 7/2015 | Yamazaki ............ H01L 29/7869 |
| 9,082,688 B2 * | 7/2015 | Yamazaki ............ H01L 27/1225 |
| 9,093,544 B2 | 7/2015 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0261325 A1 | 10/2009 | Kawamura et al. |
| 2009/0278122 A1 | 11/2009 | Hosono et al. |
| 2009/0280600 A1 | 11/2009 | Hosono et al. |
| 2010/0006834 A1 | 1/2010 | Kim et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0140100 A1 | 6/2011 | Takata et al. |
| 2011/0156026 A1 * | 6/2011 | Yamazaki ......... H01L 21/02422 257/43 |
| 2011/0240992 A1 | 10/2011 | Yamazaki |
| 2011/0240993 A1 | 10/2011 | Yamazaki |
| 2011/0240994 A1 | 10/2011 | Yamazaki |
| 2011/0240995 A1 | 10/2011 | Yamazaki |
| 2012/0280227 A1 | 11/2012 | Wakana et al. |
| 2012/0319114 A1 | 12/2012 | Yamazaki et al. |
| 2012/0319183 A1 | 12/2012 | Yamazaki et al. |
| 2013/0313550 A1 | 11/2013 | Yamazaki |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251667 A | 9/1993 |
| JP | 05-251705 A | 9/1993 |
| JP | 07-321325 A | 12/1995 |
| JP | 08-264794 A | 10/1996 |
| JP | 09-321305 A | 12/1997 |
| JP | 11-505377 | 5/1999 |
| JP | 2000-044236 A | 2/2000 |
| JP | 2000-150900 A | 5/2000 |

(56) References Cited

FOREIGN PATENT DOCUMENTS

| | | |
|---|---|---|
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2008-140984 A | 6/2008 |
| JP | 2009-111125 A | 5/2009 |
| JP | 2009-260002 A | 11/2009 |
| JP | 2010-034534 A | 2/2010 |
| JP | 2010-199307 A | 9/2010 |
| JP | 2011-502364 | 1/2011 |
| JP | 2011-035223 A | 2/2011 |
| JP | 2011-119718 A | 6/2011 |
| JP | 2011-124360 A | 6/2011 |
| TW | 200937613 | 9/2009 |
| WO | WO-2004/114391 | 12/2004 |
| WO | WO-2008/136505 | 11/2008 |
| WO | WO-2009/058842 | 5/2009 |
| WO | WO-2011/055620 | 5/2011 |
| WO | WO-2011/065329 | 6/2011 |

OTHER PUBLICATIONS

Ono.M et al., "Novel High Performance IGZO-TFT with High Mobility over 40 cm2/Vs and High Photostability Incorporated Oxygen Diffusion", IDW '11 : Proceedings of the 18th International Display Workshops, Dec. 7, 2011, pp. 1689-1690.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In-Ga-Zn-Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In, Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

(56) References Cited

OTHER PUBLICATIONS

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTs", IDW '09 : Proceedings of the 16th International Display Workshops, 2009, pp. 689-692.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by Peald Grown ZnO TFT", IMID '07 Digest, 2007, pp. 1249-1252.

Godo.H et al., "Temperature Dependence of Characteristics and Electronic Structure for Amorphous In-Ga-Zn-Oxide TFT", AM-FPD '09 Digest of Technical Papers, Jul. 1, 2009, pp. 41-44.

Osada.T et al., "Development of Driver-Integrated Panel Using Amorphous In-Ga-Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H, "68.3: Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT", SID Digest '09 : SID International Symposium Digest of Technical Papers, May 31, 2009, pp. 1110-1112.

Ohara.H et al., "21.3:4.0 In. QVGA AMOLED Display Using In-Ga-Zn-Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED ", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure". Nirim Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B. (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clarks et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

International Search Report (Application No. PCT/JP2012/003633) Dated Aug. 14, 2012.

Written Opinion (Application No. PCT/JP2012/003633) Dated Aug. 14, 2012.

\* cited by examiner

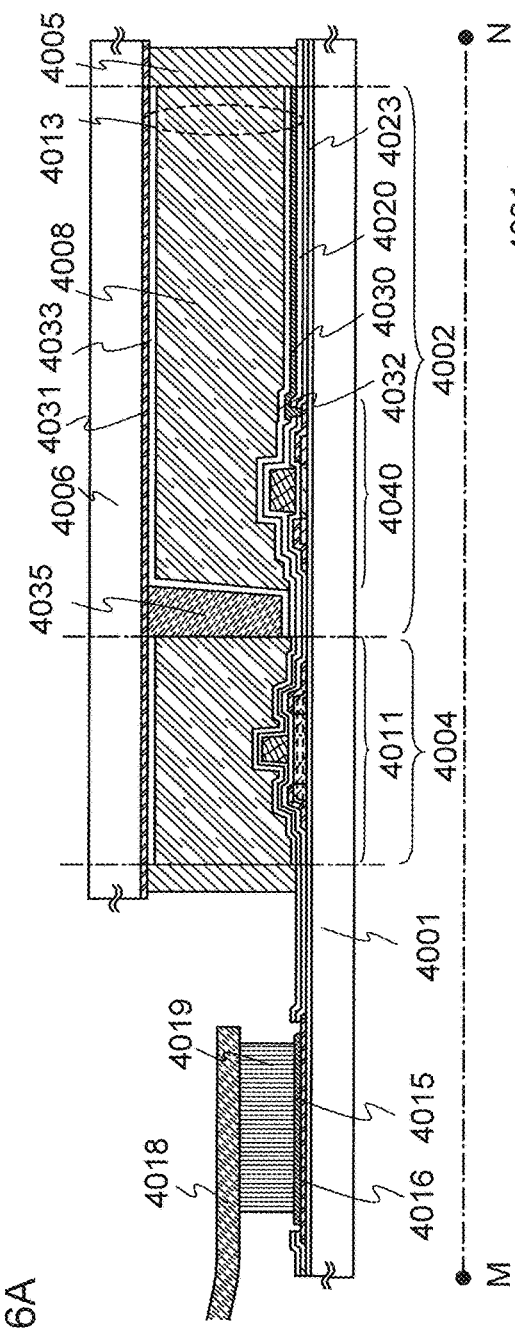
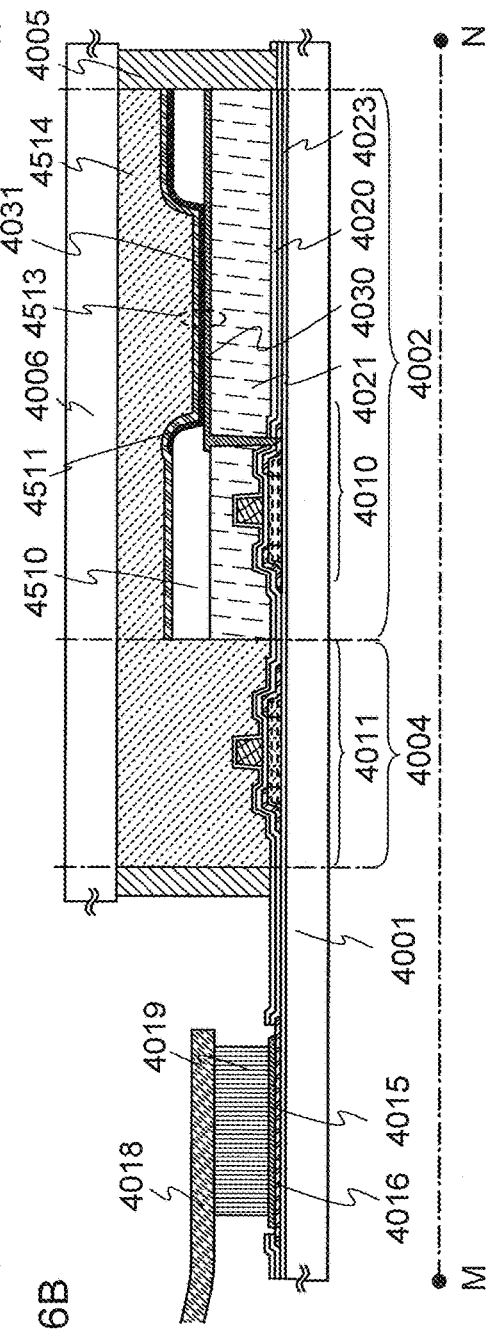
FIG. 6A
FIG. 6B

SEMICONDUCTOR DEVICE AND METHOD FOR MANUFACTURING THE SAME

TECHNICAL FIELD

One embodiment of the invention to be disclosed relates to a semiconductor device and a method for manufacturing the semiconductor device.

In this specification, a semiconductor device generally means a device which can function by utilizing semiconductor characteristics, and an electrooptic device, a semiconductor circuit, and an electronic device are all semiconductor devices.

BACKGROUND ART

In recent years, semiconductor devices have been developed to be used as an LSI, a CPU, or a memory. A CPU is an aggregation of semiconductor elements each provided with an electrode which is a connection terminal, which includes a semiconductor integrated circuit (including at least a transistor and a memory) separated from a semiconductor wafer.

A semiconductor circuit (IC chip) of an LSI, a CPU, or a memory is mounted on a circuit board, for example, a printed wiring board, to be used as one of components of a variety of electronic devices.

A technique for manufacturing a transistor by using an oxide semiconductor film for a channel formation region, or the like has been attracting attention. Examples of such a transistor include a transistor in which zinc oxide (ZnO) is used as an oxide semiconductor film and a transistor in which $InGaO_3(ZnO)_m$ is used as an oxide semiconductor film. A technique for manufacturing such a transistor including an oxide semiconductor film over a light-transmitting substrate and applying it to a switching element or the like of an image display device is disclosed in Patent Documents 1 and 2.

REFERENCE

[Patent Document 1] Japanese Published Patent Application No. 2007-123861
[Patent Document 2] Japanese Published Patent Application No. 2007-096055

DISCLOSURE OF INVENTION

Further, it is preferable that a channel be formed at a positive threshold voltage ($V_{th}$) which is as close to 0 V as possible in a transistor used in a semiconductor device. If the threshold voltage of the transistor is negative, the transistor tends to be in a so-called normally-on state, in which current flows between the source electrode and the drain electrode even when the gate voltage is 0 V.

An object of one embodiment of the present invention is to provide a structure of a transistor with a positive threshold voltage value, which enables a so-called normally-on switching element, and to provide a manufacturing method thereof. Such a transistor is an n-channel transistor in which an oxide semiconductor is used for a channel formation region.

Further, it is important to achieve the characteristics of a transistor close to the normally-off characteristics even when the transistor is not a normally-off transistor depending on the material or the manufacturing condition. Another object of one embodiment of the present invention is to provide a structure for achieving a threshold voltage of a transistor close to zero even when the threshold voltage is negative, that is, even when the transistor is a so-called normally-on transistor, and to provide a manufacturing method thereof.

Further, another object of one embodiment of the present invention is to provide a structure of a semiconductor device which achieves high-speed response and high-speed operation by improving on characteristics of a transistor (e.g., on-state current or field-effect mobility), and to provide a manufacturing method thereof, in order to achieve a high-performance semiconductor device.

Further, it is important to reduce leakage current for achieving a semiconductor device with low power consumption because the amount of power consumed by the semiconductor device depends on the leakage current of a transistor. Thus, another object of one embodiment of the present invention is to provide a structure for reducing generation of leakage current between a source electrode layer and a drain electrode layer (parasitic channel) of a transistor.

One embodiment of the present invention achieves at least one of the above objects.

A transistor of one embodiment of the present invention includes an oxide semiconductor layer in which oxide semiconductors with different energy gaps and/or different electron affinities from each other are stacked (hereinafter, also referred to as oxide semiconductor stack). Further, the oxide semiconductor stack has a region containing a larger amount of oxygen than that of the stoichiometric composition (hereinafter, also referred to as oxygen-excess region).

For example, a transistor is formed using an oxide semiconductor stack in which a first oxide semiconductor layer and a second oxide semiconductor layer with an energy gap different from an energy gap of the first oxide semiconductor layer are stacked and which has an oxygen-excess region. Here, the first oxide semiconductor layer and the second oxide semiconductor layer preferably have different energy gaps from each other, and the stacked order can be interchanged. Specifically, the energy gap of one of the oxide semiconductor layers may be 3 eV or larger, and an energy gap of the other oxide semiconductor layer may be smaller than 3 eV.

Note that in this specification and the like, the term "energy gap" is used to mean the terms "band gap" and "forbidden band gap".

Further, the oxide semiconductor stack may include three or more oxide semiconductor layers. In the case where the oxide semiconductor stack includes three or more oxide semiconductor layers, all oxide semiconductor layers may have different energy gaps from each other, or some of oxide semiconductor layers in the oxide semiconductor stack may have energy gaps equivalent to each other.

For example, an oxide semiconductor stack can include: a first oxide semiconductor layer; a second oxide semiconductor layer which is provided over the first oxide semiconductor layer and has a higher electron affinity than the first oxide semiconductor layer or a smaller energy gap than the first oxide semiconductor layer; and a third oxide semiconductor layer which is provided over the second oxide semiconductor layer to cover side surfaces of the second oxide semiconductor layer. Note that the electron affinity and the energy gap of the third oxide semiconductor layer are preferably equivalent to those of the first oxide semiconductor layer. The electron affinity means an energy gap between a vacuum level and a conduction band of an oxide semiconductor. The second oxide semiconductor layer with a small energy gap is sandwiched between the first oxide semiconductor layer with a large energy gap and the third oxide semiconductor layer with a large energy gap. With such a structure of an oxide semiconductor stack, an effect of reducing the off-state current (leakage current) of a transistor can be obtained.

Specifically, the energy gaps of the first oxide semiconductor layer and the third oxide semiconductor layer are each 3 eV or larger, and the energy gap of the second oxide semiconductor layer is smaller than 3 eV. In a transistor including an oxide semiconductor layer, the energy gap of the oxide semiconductor layer affects electric characteristics of the transistor. For example, in a transistor including an oxide semiconductor layer which has a small energy gap, on characteristics (e.g., on-state current or field-effect mobility) are improved. On the other hand, in a transistor including an oxide semiconductor layer which has a large energy gap, the off-state current can be decreased.

With a single oxide semiconductor layer, electric characteristics of a transistor are almost determined by the energy gap of the oxide semiconductor layer; thus, it is difficult that the transistor has desired electric characteristics. However, in a transistor according to one embodiment of the present invention, an oxide semiconductor stack includes a plurality of oxide semiconductor layers with different energy gaps, whereby electric characteristics of the transistor can be accurately controlled, and accordingly desired electric characteristics can be given to the transistor.

Therefore, a semiconductor device which meets various purposes such as high performance, high reliability, and low power consumption can be provided.

One embodiment of the invention disclosed in this specification is a method for manufacturing a semiconductor device including the steps of: forming an oxide semiconductor stack which includes a first oxide semiconductor layer and a second oxide semiconductor layer with an energy gap different from an energy gap of the first oxide semiconductor layer; forming a source electrode layer or a drain electrode layer over the oxide semiconductor stack; forming a gate insulating film over the source electrode layer or the drain electrode layer; introducing oxygen into the oxide semiconductor stack from a position above the gate insulating film in a self-aligned manner with use of the source electrode layer or the drain electrode layer as a mask; and forming a gate electrode layer overlapping with the oxide semiconductor stack with the gate insulating film positioned therebetween.

Another embodiment of the invention disclosed in this specification is a method for manufacturing a semiconductor device including the steps of: forming an oxide semiconductor stack in which a first oxide semiconductor layer, a second oxide semiconductor layer with a smaller energy gap than the first oxide semiconductor layer, and a third oxide semiconductor layer with a larger energy gap than the second oxide semiconductor layer are stacked in this order; forming a source electrode layer or a drain electrode layer over the oxide semiconductor stack; forming a gate insulating film over the source electrode layer or the drain electrode layer; introducing oxygen into the oxide semiconductor stack from a position above the gate insulating film in a self-aligned manner with use of the source electrode layer or the drain electrode layer as a mask; and forming a gate electrode layer overlapping with the oxide semiconductor stack with the gate insulating film positioned therebetween.

In the above method for manufacturing a semiconductor device, it is preferable that the third oxide semiconductor layer be stacked to cover side surfaces of the first oxide semiconductor layer and side surfaces of the second oxide semiconductor layer.

The third oxide semiconductor layer is formed to cover side surfaces of the first oxide semiconductor layer and side surfaces of the second oxide semiconductor layer, whereby an increase of oxygen vacancies in the second oxide semiconductor layer is suppressed, and the threshold voltage of the transistor can be close to zero. Further, the second oxide semiconductor layer becomes a buried channel, whereby a channel formation region can be distanced from an interface with an insulating film; accordingly, interface scattering of carriers is reduced, and high field-effect mobility can be achieved.

In any of the above methods for manufacturing a semiconductor device, it is preferable that after formation of the gate electrode layer, dopant be introduced into the oxide semiconductor stack in a self-aligned manner with use of the gate electrode layer as a mask.

Further, in any of the above methods for manufacturing a semiconductor device, an interlayer insulating film may be formed over the gate electrode, a contact hole reaching the source electrode layer or the drain electrode layer may be formed in the interlayer insulating film, and a wiring layer connected to the source electrode layer or the drain electrode layer through the contact hole may be formed over the interlayer insulating film.

Another embodiment of the present invention is a semiconductor device including: an oxide semiconductor stack which includes a first oxide semiconductor layer and a second oxide semiconductor layer with an energy gap different from an energy gap of the first oxide semiconductor layer; a source electrode layer or a drain electrode layer provided over the oxide semiconductor stack; a gate insulating film provided over the source electrode layer or the drain electrode layer; and a gate electrode layer overlapping with the oxide semiconductor stack with the gate insulating film positioned therebetween. In the oxide semiconductor stack, a region which overlaps with neither the source electrode layer nor the drain electrode layer has a higher oxygen concentration than a region which overlaps with the source electrode layer or the drain electrode layer.

Another embodiment of the present invention is a semiconductor device including: an oxide semiconductor stack which includes a first oxide semiconductor layer, a second oxide semiconductor layer which is in contact with the first oxide semiconductor layer and has a smaller energy gap than the first oxide semiconductor layer, and a third oxide semiconductor layer which is in contact with the second oxide semiconductor layer and has a larger energy gap than the second oxide semiconductor layer; a source electrode layer or a drain electrode layer provided over the oxide semiconductor stack; a gate insulating film provided over the source electrode layer or the drain electrode layer; and a gate electrode layer overlapping with the oxide semiconductor stack with the gate insulating film positioned therebetween. In the oxide semiconductor stack, a region which overlaps with neither the source electrode layer nor the drain electrode layer has a higher oxygen concentration than a region which overlaps with the source electrode layer or the drain electrode layer.

In the semiconductor device with the above structure, the first oxide semiconductor layer and the second oxide semiconductor layer can be formed with use of the same mask, and the third oxide semiconductor layer is formed to overlap with the second oxide semiconductor layer and have a larger area than the second oxide semiconductor layer, so that the third oxide semiconductor layer covers the second oxide semiconductor layer. In the semiconductor device with such a structure, the third oxide semiconductor layer is provided to cover and be in contact with the side surfaces of the first oxide semiconductor layer and the side surfaces of the second oxide semiconductor layer, whereby the source electrode layer or the drain electrode layer provided over and in contact with the third oxide semiconductor layer is not in contact with the side surfaces of the second oxide semiconductor layer. Such a structure is preferable because generation of the leakage current between the source electrode layer and the drain electrode layer (parasitic cannel) can be reduced.

Further, a structure of the oxide semiconductor stack is not particularly limited as long as the source electrode layer or the drain electrode layer is not in contact with the side surface of the second oxide semiconductor layer. For example, the side surface of the first oxide semiconductor layer may extend beyond the side surface of the second oxide semiconductor layer, so that the third oxide semiconductor layer is in contact with part of a top surface of the first oxide semiconductor layer.

In any of the above semiconductor devices, a region in the oxide semiconductor stack, which does not overlap with the gate electrode, preferably contains dopant. In such a structure, the oxide semiconductor stack has a channel formation region which overlaps with the gate electrode layer with the gate insulating film positioned therebetween, and a pair of low-resistance regions between which the channel formation region is sandwiched in the channel length direction.

With an oxide semiconductor layer which includes low-resistance regions between which a channel formation region is sandwiched in the channel length direction, the transistor has excellent on characteristics (e.g., on-state current and field-effect mobility) and enables high-speed operation and high-speed response. Further, the low-resistance regions are formed in a self-aligned manner and do not overlap with the gate electrode layer; thus a parasitic capacitor can be reduced. Reduction of the parasitic capacitor leads to lowering of power consumption of the whole semiconductor device.

The concentration of the dopant in the low-resistance regions is preferably higher than or equal to $5 \times 10^{18}/cm^3$ and lower than or equal to $1 \times 10^{22}/cm^3$.

The dopant may be added to the oxide semiconductor stack through the source electrode layer or the drain electrode layer, depending on the thicknesses of the source electrode layer and the drain electrode layer or conditions for introducing the dopant. It is important that the dopant be prevented from being added to the channel formation region; thus, the thicknesses of the source electrode layer and the drain electrode layer are smaller than the thickness of the gate electrode layer.

In addition, any of the above semiconductor devices preferably further includes: an interlayer insulating film which is provided over the gate electrode layer and has a contact hole reaching the source electrode layer or the drain electrode layer; and a wiring layer which is provided over the interlayer insulating film and connected to the source electrode layer or the drain electrode layer through the contact hole.

According to one embodiment of the present invention, on characteristics of the transistor (e.g., on-state current or field-effect mobility) can be improved.

Further, according to one embodiment of the present invention, a normally-off transistor can be achieved. In addition, according to one embodiment of the present invention, the threshold voltage of a normally-on transistor can be made to be close to zero.

BRIEF DESCRIPTION OF DRAWINGS

FIGS. 6A and 6B each illustrate a semiconductor device according to one embodiment of the present invention.

BEST MODE FOR CARRYING OUT THE INVENTION

Figure 1A:
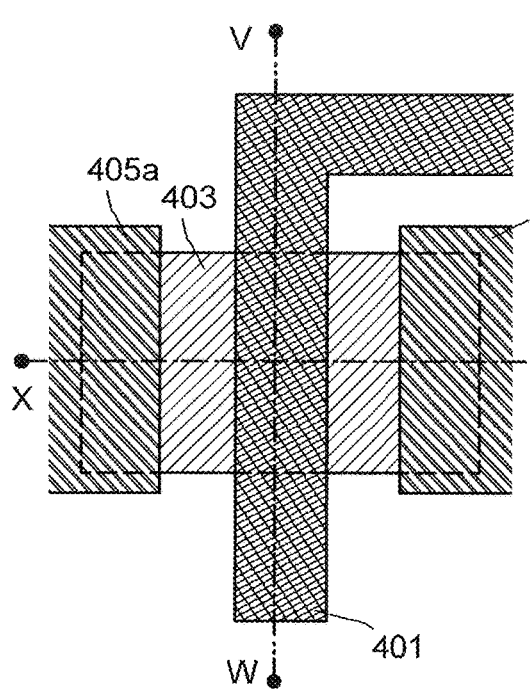
FIG. 1A is a plan view of a semiconductor device according to one embodiment of the present invention.

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention should not be limited to the descriptions of the embodiments below.

Note that in structures of the present invention described below, like portions or portions having similar functions are denoted by the same reference numerals in different drawings, and description thereof is not repeated. Further, the same hatching pattern is applied to portions having similar functions, and the portions are not especially denoted by reference numerals in some cases.

Note that in each drawing described in this specification, the size, the film thickness, or the region of each component is exaggerated for clarity in some cases. Therefore, embodiments of the present invention are not limited to such scales.

Note that the ordinal numbers such as "first", "second", and the like in this specification and the like are used for convenience and do not denote the order of steps or the stacking order of layers. In addition, the ordinal numbers in this specification and the like do not denote particular names which specify the present invention.

Embodiment 1

In this embodiment, one embodiment of a semiconductor device and one embodiment of a method for manufacturing the semiconductor device will be described with reference to FIGS. 1A to 1D, FIGS. 2A to 2D, and FIG. 3. In this embodiment, a transistor including an oxide semiconductor stack is shown as an example of the semiconductor device.

Figure 1B:
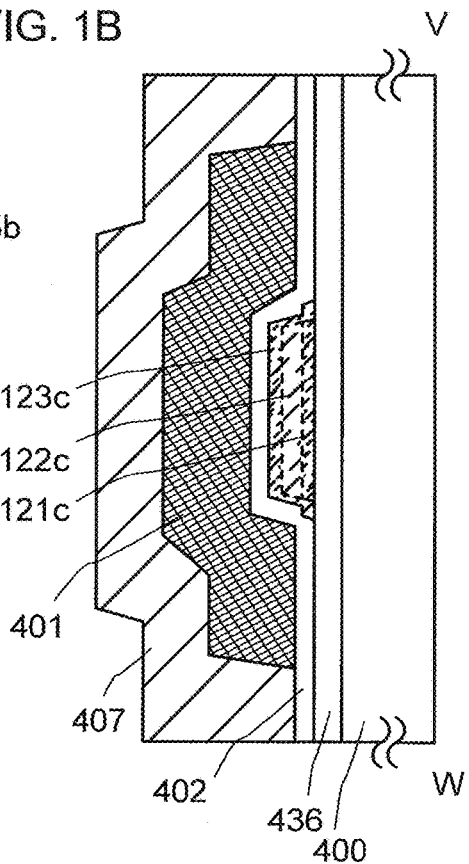
FIGS. 1B and 1C are cross-sectional views thereof.
Figure 1C:
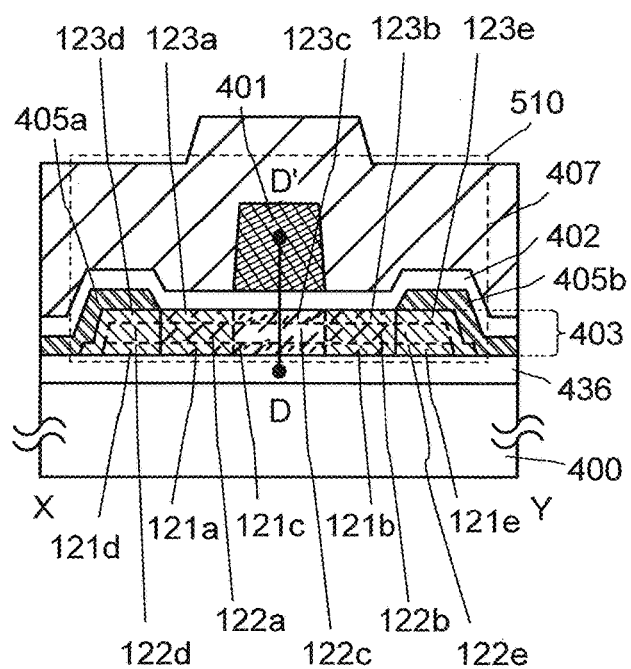

A transistor 510 illustrated in FIG. 1A, FIG. 1B, and FIG. 1C is an example of a top-gate transistor. FIG. 1A is a top view, FIG. 1B is a cross-sectional view taken along chain line X-Y in FIG. 1A, and FIG. 1C is a cross-sectional view taken along chain line V-W in FIG. 1A. Note that in FIG. 1B and FIG. 1C, interfaces between oxide semiconductor layers included in an oxide semiconductor stack 403 are schematically denoted by dotted lines. Depending on materials or deposition conditions of the oxide semiconductor layers, the interfaces between the oxide semiconductor layers are unclear in some cases. Further, in the case where the interfaces are unclear, a portion which can be called a mixed region or a mixed layer including a plurality of oxide semiconductor layers which are different from each other is formed in some cases.

As illustrated in a cross-sectional view in the channel length direction in FIG. 1B, the transistor 510 includes, over a substrate 400 which is provided with an oxide insulating film 436 to have an insulating surface, the oxide semiconductor stack 403 including a first oxide semiconductor layer, a second oxide semiconductor layer, and a third oxide semiconductor layer, a source electrode layer 405a, a drain electrode layer 405b, a gate insulating film 402, and a gate electrode layer 401. In the transistor 510, the first oxide semiconductor layer is formed over and in contact with the oxide insulating film 436, and the second oxide semiconductor layer is formed over the first oxide semiconductor layer. Further, in the transistor 510, the oxide semiconductor stack includes the third oxide semiconductor layer, and the third oxide semiconductor layer is provided to cover side surfaces of the first oxide semiconductor layer and side surfaces of the second oxide semiconductor layer. The edge portion of the third oxide semiconductor layer is in contact with the oxide insulating film.

In the oxide semiconductor stack 403, a channel formation region which overlaps with the gate electrode layer 401 with the gate insulating film 402 positioned therebetween includes three layers. In the channel formation region, a first channel formation region 121c, a second channel formation region 122c, and a third channel formation region 123c are stacked.

In the channel length direction, first low-resistance regions 121a and 121b between which the first channel formation region 121c is sandwiched are provided. In the channel length direction, second low-resistance regions 122a and 122b between which the second channel formation region 122c is sandwiched are provided. In the channel length direction, third low-resistance regions 123a and 123b between which the third channel formation region 123c is sandwiched are provided.

In addition, the oxide semiconductor stack 403 includes first regions 121d and 121e, second regions 122d and 122e, and third regions 123d and 123e, which overlap with the source electrode layer 405a or the drain electrode layer 405b.

In the oxide semiconductor stack 403 of the transistor 510 illustrated in FIGS. 1A to 1D, the first oxide semiconductor layer including the first low-resistance regions 121a and 121b, the first channel formation region 121c, and the first regions 121d and 121e, the second oxide semiconductor layer including the second low-resistance regions 122a and 122b, the second channel formation region 122c, and the second regions 122d and 122e, and the third oxide semiconductor layer including the third low-resistance regions 123a and 123b, the third channel formation region 123c, and the third regions 123d and 123e are stacked in this order.

In addition, in the transistor 510, the second oxide semiconductor layer has a smaller energy gap than the first oxide semiconductor layer, and the third oxide semiconductor layer has a larger energy gap than the second oxide semiconductor layer. Note that the energy gap of the first oxide semiconductor layer is equivalent to that of the third oxide semiconductor layer.

FIG. 1B is a cross-sectional view in the channel length direction, and in FIG. 1B, end portions of the second oxide semiconductor layer are covered with end portions of the third oxide semiconductor layer (i.e., side surfaces of the second regions 122d and 122e are covered with the third regions 123d and 123e). With such a structure, generation of the leakage current between the source electrode layer 405a and the drain electrode layer 405b (parasitic channel) can be reduced.

FIG. 1C is a cross-sectional view in the channel width direction, and as in FIG. 1B, the end portions of the second oxide semiconductor layer are preferably covered with the end portions of the third oxide semiconductor layer, (i.e., side surfaces of a second region 122c are preferably covered with a third region 123c).

Figure 1D:
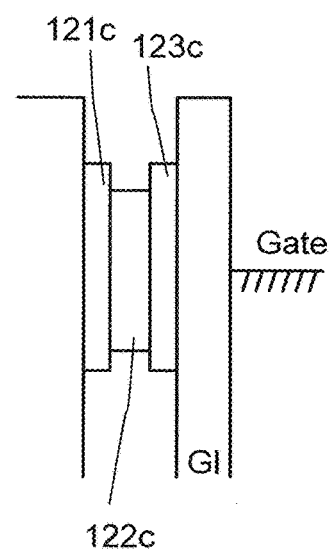
FIG. 1D is an energy band thereof.

Further, FIG. 1D is an energy band diagram in the thickness direction (between D-D') in FIG. 1B. In this embodiment, materials for a first oxide semiconductor layer, a second oxide semiconductor layer, and a third oxide semiconductor layer are selected in order to satisfy the energy band diagram of FIG. 1D. Note that when a buried channel is formed, sufficient effects can be obtained. Thus, an energy band of the oxide semiconductor stack is not necessarily limited to that shown in the energy band diagram of FIG. 1D. That is, both conduction band and valence band do not necessarily have a depression. For example, a structure such that only conduction band has a depression may be formed.

FIGS. 2A to 2D illustrate an example of a method for manufacturing a transistor.

First, over the substrate 400 having an insulating surface, the oxide insulating film 436, a first oxide semiconductor layer 101, and a second oxide semiconductor layer 102 are formed.

There is no particular limitation on a substrate that can be used as the substrate 400 having an insulating surface as long as it has heat resistance high enough to withstand heat treatment performed later. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate of silicon, silicon carbide, or the like; a compound semiconductor substrate of silicon germanium or the like; an SOI substrate; or the like can be used as the substrate 400, or the substrate provided with a semiconductor element can be used as the substrate 400.

The semiconductor device may be manufactured using a flexible substrate as the substrate 400. In order to manufacture a flexible semiconductor device, the transistor including the oxide semiconductor stack may be directly formed over a flexible substrate. Alternatively, the transistor including the oxide semiconductor stack may be formed over a manufacturing substrate, and then, the transistor may be separated and transferred to a flexible substrate. Note that in order to separate the transistor from the manufacturing substrate and transfer it to the flexible substrate, a separation layer may be provided between the manufacturing substrate and the transistor including the oxide semiconductor stack.

The oxide insulating film 436 can be formed by a plasma CVD method, a sputtering method, or the like, using silicon oxide, silicon oxynitride, aluminum oxide, aluminum oxynitride, hafnium oxide, gallium oxide, silicon nitride oxide, aluminum nitride oxide, or a mixed material of any of these materials. The oxide insulating film 436 may have either a single-layer structure or a stacked-layer structure. In this embodiment, a silicon oxide film formed by a sputtering method as the oxide insulating film 436 is used.

In the transistor 510, the oxide insulating film 436 is in contact with the lowermost layer and uppermost layer of the oxide semiconductor stack, and thus the film (bulk) of the oxide insulating film 436 preferably contains at least oxygen in excess of stoichiometric ratio. For example, in the case where a silicon oxide film is used as the oxide insulating film 436, the composition formula is $SiO_{2+\alpha}$ ($\alpha>0$). By using such a film as the oxide insulating film 436, oxygen can be supplied to the oxide semiconductor stack formed above the oxide insulating film 436, leading to favorable characteristics. By supply of oxygen to the oxide semiconductor stack, oxygen vacancies in the film can be filled.

During a formation step of an oxide semiconductor stack over the oxide insulating film 436, it is preferable that hydrogen or water be contained in the first oxide semiconductor layer 101 and the second oxide semiconductor layer 102 as little as possible. Thus, as pretreatment of formation of the first oxide semiconductor layer 101 and the second oxide semiconductor layer 102, it is preferable that the substrate provided with the oxide insulating film 436 be preheated in a preheating chamber of a sputtering apparatus, so that impurities such as hydrogen or moisture adsorbed on the substrate and the oxide insulating film 436 are eliminated and evacuation is preferably performed. As an evacuation unit provided in the preheating chamber, a cryopump is preferable.

Oxide semiconductors used for the oxide semiconductor stack preferably contains at least indium (In) or zinc (Zn). In particular, In and Zn are preferably contained. In addition, as a stabilizer for reducing the variation in electric characteristics of a transistor using the oxide, the oxide semiconductor preferably contains gallium (Ga) in addition to In and Zn. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure. Note that in some cases, the energy gap is different between single crystal and non-single-crystal even when a material of the single crystal is same as a material of the non-single-crystal. Thus, it is important to select a crystal state of a material in the oxide semiconductor as appropriate. Materials of the first oxide semiconductor layer 101 and the second oxide semiconductor layer 102 are selected so that the energy band diagram shown in FIG. 1D is satisfied.

Further, as the oxide semiconductor stack, an oxide semiconductor film including a crystal and having crystallinity (crystalline oxide semiconductor film) can be used. A crystalline state in a crystalline oxide semiconductor film may be a state in which crystal axes are oriented in random directions or a state in which crystal axes are oriented in a certain direction.

For example, as the crystalline oxide semiconductor film, an oxide semiconductor film including a crystal having a c-axis substantially perpendicular to a surface can be used.

The oxide semiconductor film including a crystal having a c-axis substantially perpendicular to a surface has neither a single crystal structure nor an amorphous structure and is a c-axis aligned crystalline oxide semiconductor (CAAC-OS) film having c-axis alignment.

The CAAC-OS film is not completely single crystal nor completely amorphous. The CAAC-OS film is an oxide semiconductor film with a crystal-amorphous mixed phase structure where crystal parts and amorphous parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electric characteristics of the transistor due to irradiation with visible light or ultraviolet light can be reduced. Thus, the transistor has high reliability.

Each of the first oxide semiconductor layer 101 and the second oxide semiconductor layer 102 has a thickness greater than or equal to 5 nm and less than or equal to 100 nm (preferably greater than or equal to 5 nm and less than or equal to 30 nm) and can be formed by a sputtering method, a molecular beam epitaxy (MBE) method, a CVD method, a pulse laser deposition method, an atomic layer deposition (ALD) method, or the like as appropriate. Each of the first oxide semiconductor layer 101 and the second oxide semiconductor layer 102 may be formed with a sputtering apparatus where film formation is performed with surfaces of a plurality of substrates set substantially perpendicular to a surface of a sputtering target, which is a so-called columnar plasma (CP) sputtering system.

Note that each of the first oxide semiconductor layer 101 and the second oxide semiconductor layer 102 is preferably deposited under conditions such that much oxygen is contained (for example, by a sputtering method in an atmosphere of 100% oxygen) so as to be a film containing much oxygen (preferably having a region containing an excess of oxygen as compared to the stoichiometric composition ratio of the oxide semiconductor in a crystalline state).

In this embodiment, the target used for formation of the first oxide semiconductor layer 101 by a sputtering method is, for example, a metal oxide target having a composition ratio where $In_2O_3:Ga_2O_3:ZnO=1:1:2$ [molar ratio], so that an In—Ga—Zn—O-based film is formed. The material and the component of the target are not limited thereto, for example, a metal oxide target having a composition ratio, $In_2O_3:Ga_2O_3:ZnO=1:1:1$ [molar ratio] may be used.

It is preferable to use a high-purity gas from which impurities such as hydrogen, water, a hydroxyl group, or a hydride are removed as a sputtering gas used when the first oxide semiconductor layer 101 and the second oxide semiconductor layer 102 are formed.

The oxide insulating film 436 and the oxide semiconductor stack are preferably formed in succession without being exposed to the air. When the oxide insulating film 436 and the oxide semiconductor stack are formed in succession without being exposed to the air, impurities such as hydrogen or moisture can be prevented from being adsorbed onto a surface of the oxide insulating film 436.

For example, the CAAC-OS film is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the sputtering target, an In—Ga—Zn—O compound target is described below.

The In—Ga—Zn—O compound target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y and Z are given positive numbers. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

Figure 2A:
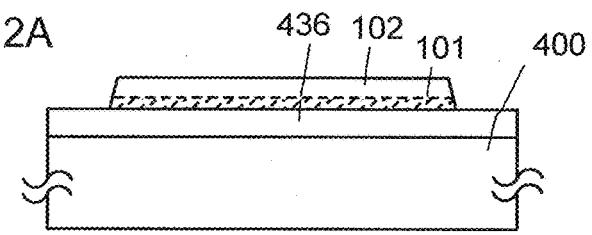
FIGS. 2A to 2D illustrate a method for manufacturing a semiconductor device according to one embodiment of the present invention.

In this embodiment, a first photolithography step is performed so that the formed oxide semiconductor stack is processed to have an island-shaped first oxide semiconductor layer 101 and an island shaped second oxide semiconductor layer 102, as illustrated in FIG. 2A. A resist mask used for forming the island-shaped first oxide semiconductor layer 101 and the island-shaped second oxide semiconductor layer 102 may be formed by an inkjet method. Formation of the resist mask by an inkjet method needs no photomask; thus, manufacturing cost can be reduced.

Note that the etching of the oxide semiconductor stack may be performed using either dry etching or wet etching or both of them. As an etchant used for wet etching of the oxide semiconductor film, for example, a mixed solution of phosphoric acid, acetic acid, and nitric acid, or the like can be used. In addition, ITO07N (produced by KANTO CHEMICAL CO., INC.) may also be used.

Next, a third oxide semiconductor layer 103 is formed to cover the island-shaped first oxide semiconductor layer 101 and the island-shaped second oxide semiconductor layer 102. As a result, the oxide semiconductor stack 403 is formed. The third oxide semiconductor layer 103 is formed using a target same as that for the first oxide semiconductor layer 101. The deposition conditions of the third oxide semiconductor layer 103 are the same as that of the first oxide semiconductor layer 101; thus description thereof is omitted here. Note that by a second photolithography step, the third oxide semiconductor layer 103 which overlaps with the second oxide semiconductor layer 102 and has a top surface shape larger than a plan area of the second oxide semiconductor layer 102 is formed.

Then, heat treatment may be performed on the oxide semiconductor stack 403 in order to remove excess hydrogen (including water and a hydroxyl group) (to perform dehydration or dehydrogenation). The temperature of the heat treatment is higher than or equal to 300° C. and lower than or equal to 700° C., or lower than the strain point of the substrate. The heat treatment can be performed under reduced pressure or in a nitrogen atmosphere, or the like. For example, the substrate is put in an electric furnace which is a kind of heat treatment apparatus, and the oxide semiconductor stack 403 is subjected to the heat treatment at 450° C. for an hour in a nitrogen atmosphere.

Further, a heat treatment apparatus used is not limited to an electric furnace, and a device for heating a process object by heat conduction or heat radiation from a heating element such as a resistance heating element may be alternatively used. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used.

For example, as the heat treatment, GRTA may be performed as follows. The substrate is put in an inert gas heated at high temperature of 650° C. to 700° C., is heated for several minutes, and is taken out from the inert gas.

Note that in the heat treatment, it is preferable that water, hydrogen, and the like be not contained in nitrogen or a rare gas such as helium, neon, or argon. The purity of nitrogen or the rare gas such as helium, neon, or argon which is introduced into the heat treatment apparatus is set to preferably 6N (99.9999%) or higher, far preferably 7N (99.99999%) or higher (that is, the impurity concentration is preferably 1 ppm or lower, far preferably 0.1 ppm or lower).

In addition, after the oxide semiconductor stack 403 is heated by the heat treatment, a high-purity oxygen gas, a high-purity $N_2O$ gas, or ultra dry air (the moisture amount is less than or equal to 20 ppm (−55° C. by conversion into a dew point), preferably less than or equal to 1 ppm, far preferably less than or equal to 10 ppb, in the measurement with use of a dew point meter of a cavity ring down laser spectroscopy (CRDS) system) may be introduced into the same furnace while the heating temperature is maintained or slow cooling is performed to lower the temperature from the heating temperature. It is preferable that water, hydrogen, or the like be not contained in the oxygen gas or the $N_2O$ gas. The purity of the oxygen gas or the $N_2O$ gas which is introduced into the heat treatment apparatus is preferably 6N or more, far preferably 7N or more (i.e., the impurity concentration in the oxygen gas or the $N_2O$ gas is preferably 1 ppm or lower, far preferably 0.1 ppm or lower). The oxygen gas or the $N_2O$ gas acts to supply oxygen that is a main component of the oxide semiconductor and that has been reduced by removing an impurity for the dehydration or dehydrogenation, so that the oxide semiconductor stack 403 can have high purity and be an electrically i-type (intrinsic) oxide semiconductor film.

Next, a conductive film to be the source electrode layer and the drain electrode layer (including a wiring formed from the same layer as the source electrode layer and the drain electrode layer) is formed over the oxide semiconductor stack 403. The conductive film is formed using a material that can withstand heat treatment in a later step. As the conductive film used for the source electrode layer and the drain electrode layer, for example, a metal film containing an element selected from Al, Cr, Cu, Ta, Ti, Mo, or W, a metal nitride film containing any of the above elements as its component (a titanium nitride film, a molybdenum nitride film, or a tungsten nitride film), or the like can be used. A metal film having a high melting point, which includes Ti, Mo, W, or the like, or a metal nitride film of any of these elements (a titanium nitride film, a molybdenum nitride film, and a tungsten nitride film) may be stacked on one of or both of a lower side or an upper side of a metal film including Al, Cu, or the like. Alternatively, the conductive film used for the source electrode layer and the drain electrode layer may be formed using a conductive metal oxide. Indium oxide ($In_2O_3$), tin oxide ($SnO_2$), zinc oxide (ZnO), indium oxide-tin oxide ($In_2O_3$—$SnO_2$), indium oxide-zinc oxide ($In_2O_3$—ZnO), or any of these metal oxide materials containing silicon oxide can be used as the conductive metal oxide.

Figure 2B:
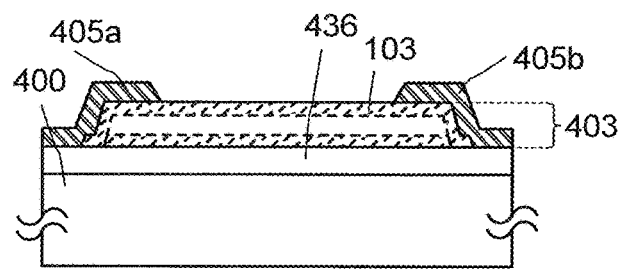

A resist mask is formed over the conductive film by a third photolithography step. Etching is selectively performed, so that the source electrode layer 405a and the drain electrode layer 405b are formed. Then, the resist mask is removed. FIG. 2B illustrates a cross section at this stage. In this embodiment, a 10-nm-thick tungsten film is formed as the source electrode layer 405a and the drain electrode layer 405b. When the source electrode layer 405a and the drain electrode layer 405b have the small thickness as the above, coverage with the gate insulating film 402 formed thereover can be favorable, and through the source electrode layer 405a and the drain electrode layer 405b, dopant can be introduced in the oxide semiconductor stack 403 below the source electrode layer 405a and the drain electrode layer 405b.

Next, the gate insulating film 402 is formed to cover the oxide semiconductor stack 403, the source electrode layer 405a, and the drain electrode layer 405b.

The gate insulating film 402 can be formed to have a thickness greater than or equal to 1 nm and less than or equal to 20 nm by a sputtering method, an MBE method, a CVD method, a pulse laser deposition method, an ALD method, or the like as appropriate. Alternatively, the gate insulating film 402 may be formed with a sputtering apparatus where film formation is performed with surfaces of a plurality of substrates set substantially perpendicular to a surface of a sputtering target, which is a so-called columnar plasma (CP) sputtering system.

The gate insulating film 402 can be formed using a silicon oxide film, a gallium oxide film, an aluminum oxide film, a silicon nitride film, a silicon oxynitride film, an aluminum oxynitride film, or a silicon nitride oxide film.

The gate insulating film 402 can be formed using a high-k material such as hafnium oxide, yttrium oxide, hafnium silicate ($HfSi_xO_y$ (x>0, y>0)), hafnium silicate to which nitrogen is added ($HfSiO_xN_y$ (x>0, y>0)), hafnium aluminate ($HfAl_xO_y$ (x>0, y>0)), or lanthanum oxide, whereby gate leakage current can be reduced. Further, the gate insulating film 402 may have either a single-layer structure or a stacked-layer structure.

Figure 2C:
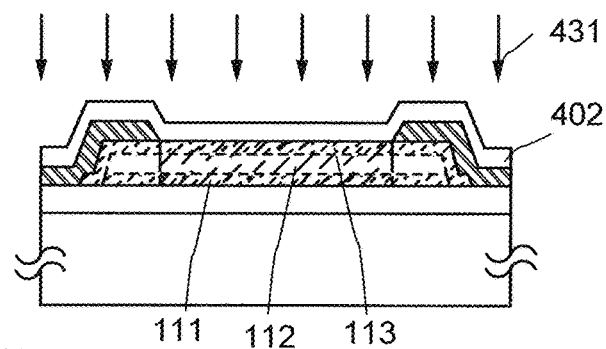

Next, as illustrated in FIG. 2C, oxygen 431 is introduced into the oxide semiconductor stack 403 with use of the source electrode layer 405a and the drain electrode layer 405b as masks. By introducing oxygen (including at least one of an oxygen radical, an oxygen atom, and an oxygen ion), oxygen is supplied at least into the third oxide semiconductor layer. As a method for introducing oxygen, an ion implantation method, an ion doping method, a plasma immersion ion implantation method, plasma treatment, or the like may be used.

By introducing oxygen into the oxide semiconductor stack 403, a region which is in the oxide semiconductor stack 403 and overlaps with neither the source electrode layer 405a nor the drain electrode layer 405b has a higher oxygen concentration than a region which overlaps with the source electrode layer 405a or the drain electrode layer 405b. It is preferable that the oxygen content in the region which overlaps with neither the source electrode layer 405a nor the drain electrode layer 405b be increased to higher than that of the stoichiometric composition ratio by oxygen introducing treatment. For example, a peak of the concentration of oxygen which is introduced into the region of the oxide semiconductor stack 403 by the oxygen introducing treatment is preferably higher than or equal to $1\times10^{18}/cm^3$ and lower than or equal to $5\times10^{21}/cm^3$.

In this embodiment, as a region which contains oxygen in excess of stoichiometry (oxygen-excess region), a first oxygen-excess region 111, a second oxygen-excess region 112, and a third oxygen-excess region 113 are formed in a self-aligned manner, by introducing the oxygen 431. Note that the oxygen 431 may be contained at least in the interface between the third oxide semiconductor layer 103 and the gate insulating film 402. Thus, depending on the depth at which the oxygen 431 is introduced, in the first oxide semiconductor layer 101 and the second oxide semiconductor layer 102, the oxygen concentration in a region which overlaps with the source electrode layer 405a or the drain electrode layer 405b are equal to that in a region which overlaps with neither the source electrode layer 405a nor the drain electrode layer 405b, in some cases. The depth at which the oxygen is introduced into the oxide semiconductor stack 403 may be controlled by appropriately setting an implantation condition such as acceleration voltage or a dose, or the thickness of the gate insulating film 402 through which the oxygen passes.

The timing of introducing the oxygen 431 is not limited to the timing after formation of the gate insulating film 402. However, when oxygen is introduced through a film stacked over the oxide semiconductor stack 403, the depth at which oxygen is introduced (introduction region) is controlled easily, which enables efficient oxygen implantation into the oxide semiconductor stack 403.

Further, heat treatment may be performed after the oxygen 431 is introduced. As the preferable heating conditions, the heat temperature is higher than or equal to 250° C. and lower than or equal to 700° C., preferably higher than or equal to 300° C. and lower than or equal to 450° C., and the heat treatment is preferably performed in an oxygen atmosphere. Further, the heat treatment may be performed in a nitrogen atmosphere, or under reduced pressure or the air (ultra dry air).

In the case where at least one of layers in the oxide semiconductor stack is a crystalline oxide semiconductor film, part of the crystalline oxide semiconductor film becomes amorphous in some cases by introduction of the oxygen 431. In that case, the crystallinity of the oxide semiconductor stack can be recovered by performing heat treatment thereon after the introduction of the oxygen 431.

Further, in the case where an oxygen-excess region is formed in the oxide semiconductor stack 403, oxygen vacancies can be immediately filled; thus, charge trapping centers in the oxide semiconductor stack 403 can be reduced. There is an oxygen vacancy in a portion where oxygen is detached in the oxide semiconductor stack 403 and a donor level which leads to variation in the electric characteristics of a transistor is formed owing to the oxygen vacancy. Since oxygen vacancies in the film can be filled by introduction of oxygen, with use of such an oxide semiconductor stack for transistors, variation in threshold voltages $V_{th}$ of the transistors owing to oxygen vacancies, and the shift of the threshold voltage $\Delta V_{th}$ can be reduced. In addition, the threshold voltage can be positively shifted to make a normally-off transistor.

Next, the gate electrode layer 401 is formed over the gate insulating film 402 by a plasma CVD method, a sputtering method, or the like. The gate electrode layer 401 can be formed using a metal material such as molybdenum, titanium, tantalum, tungsten, aluminum, copper, chromium, neodymium, or scandium or an alloy material which contains any of these materials as its main component. Alternatively, a semiconductor film typified by a polycrystalline silicon film doped with an impurity element such as phosphorus, or a silicide film such as a nickel silicide film may be used as the gate electrode layer 401. The gate electrode layer 401 may have a single-layer structure or a stacked-layer structure.

The gate electrode layer 401 can also be formed using a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible that the gate electrode layer 401 has a stacked structure of the above conductive material and the above metal material.

As one layer of the gate electrode layer 401 which is in contact with the gate insulating film 402, a metal oxide containing nitrogen, specifically, an In—Ga—Zn-based oxide film containing nitrogen, an In—Sn-based oxide film containing nitrogen, an In—Ga-based oxide film containing nitrogen, an In—Zn-based oxide film containing nitrogen, a Sn-based oxide film containing nitrogen, an In-based oxide film containing nitrogen, or a metal nitride (e.g., InN or SnN) film can be used. Such a film has a work function of 5 eV or higher, preferably 5.5 eV or higher, and use of this film as the gate electrode layer enables the threshold voltage of electric characteristics of a transistor makes a positive value. Accordingly, a so-called normally-off switching element can be obtained.

Next, treatment in which dopant 421 is selectively introduced is preferably performed. In this treatment, with use of the gate electrode layer 401 as a mask, the dopant 421 is introduced though the gate insulating film 402, so that the first low-resistance regions 121a and 121b, the second low-resistance regions 122a and 122b, and the third low-resistance regions 123a and 123b are formed. Through this treatment, the first low-resistance regions 121a and 121b between which the first channel formation region 121c is sandwiched are formed in the channel length direction in a self-aligned manner. Further, the second low-resistance regions 122a and 122b between which the second channel formation region 122c is sandwiched are formed in the channel length direction in a self-aligned manner. Furthermore, the third low-resistance regions 123a and 123b between which the third channel formation region 123c is sandwiched are formed in the channel length direction in a self-aligned manner.

In the transistor 510 of this embodiment, the first low-resistance regions 121a and 121b, the second low-resistance regions 122a and 122b, and the third low-resistance regions 123a and 123b are regions containing the dopant and excess oxygen.

Figure 2D:
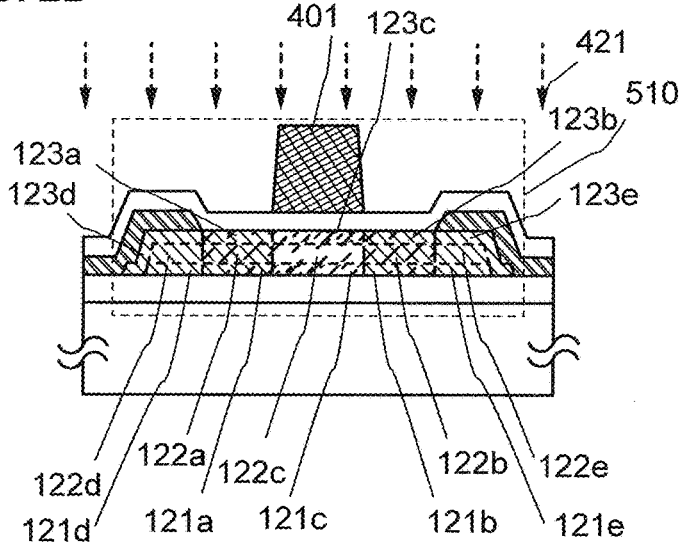

In addition, in this treatment, the dopant 421 is selectively introduced into the oxide semiconductor stack 403 (at least into the third oxide semiconductor layer 103) through the gate insulating film 402, the source electrode layer 405a, and the drain electrode layer 405b, so that the first regions 121d and 121e, the second regions 122d and 122e, and the third regions 123d and 123e are formed (see FIG. 2D). The dopant 421 is also introduced below the source electrode layer 405a and the drain electrode layer 405b, whereby resistance of the first regions 121d and 121e, the second regions 122d and 122e, and the third regions 123d and 123e can be reduced.

The low-resistance regions between which the channel formation region is sandwiched is formed in the channel length direction in the oxide semiconductor stack 403 by introducing the dopant 421, whereby the on characteristics of the transistor 510 are improved, high-speed operation and high-speed response of the transistor can be achieved. Further, the low-resistance regions are formed in a self-aligned manner and do not overlap with the gate electrode; thus, parasitic capacitor can be reduced. A reduction in parasitic capacitor leads to lowering of power consumption of the whole semiconductor device.

In this embodiment, since the source electrode layer 405a and the drain electrode layer 405b are thin, the dopant 421 is also introduced into portions of the oxide semiconductor stack 403 below the source electrode layer 405a and the drain electrode layer 405b. Depending on the thicknesses of the source electrode layer 405a and the drain electrode layer 405b and the conditions for introducing the dopant 421, the dopant 421 is not introduced into portions of the oxide semiconductor stack below the source electrode layer 405a and the drain electrode layer 405b.

The introduction of the dopant 421 may be controlled by appropriately setting an implantation condition such as acceleration voltage or a dose, or the thickness of the gate insulating film 402 through which the dopant passes. For example, in the case where boron is used and boron ions are implanted by an ion implantation method, the dose can be greater than or equal to $1 \times 10^{13}$ ions/cm$^2$ and less than or equal to $5 \times 10^{16}$ ions/cm$^2$.

The concentrations of the dopant 421 in the first low-resistance regions 121a and 121b, the second low-resistance regions 122a and 122b, and the third low-resistance regions 123a and 123b are preferably higher than or equal to $5 \times 10^{18}$/cm$^3$ and lower than or equal to $1 \times 10^{22}$/cm$^3$.

The introduction of the dopant may be performed while the substrate 400 is heated.

Note that the treatment in which the dopant 421 is introduced into the first low-resistance regions 121a and 121b, the second low-resistance regions 122a and 122b, and the third low-resistance regions 123a and 123b may be performed plural times, and a plural kinds of dopants may be used.

After the dopant 421 is introduced, heat treatment may be performed. As the preferable heating conditions, the heat temperature is higher than or equal to 300° C. and lower than or equal to 700° C., preferably higher than or equal to 300° C. and lower than or equal to 450° C., and the heat treatment is preferably performed for an hour in an oxygen atmosphere. Further, the heat treatment may be performed in a nitrogen atmosphere, or under reduced pressure or air (ultra dry air).

In the case where at least one of layers in the oxide semiconductor stack is a crystalline oxide semiconductor film, part of the crystalline oxide semiconductor film becomes amorphous in some cases by introduction of the dopant 421. In that case, the crystallinity of the oxide semiconductor stack can be recovered by performing heat treatment thereon after the introduction of the dopant 421.

In this embodiment, boron is used as the dopant. Thus, the first low-resistance regions 121a and 121b, the second low-resistance regions 122a and 122b, and the third low-resistance regions 123a and 123b contain boron and an excess of oxygen.

Through the above-described steps, the transistor 510 of this embodiment is formed.

Note that an insulating film 407 may be formed to cover the transistor (see FIG. 1B and FIG. 1C).

As the insulating film 407, a silicon oxide film, or an inorganic insulating film such as, typically, an aluminum oxide film, a silicon oxynitride film, an aluminum oxynitride film, or a gallium oxide film can be used. For example, as the insulating film 407, a stacked layer including a silicon oxide film and an aluminum oxide film can be used.

An aluminum oxide film which can be used for the insulating film 407 has a superior shielding effect (blocking effect), which is not permeable to either oxygen or impurities such as hydrogen or moisture.

As the insulating film 407, a planarization insulating film may be used. As the planarization insulating film, an organic material such as a polyimide resin, an acrylic resin, or a benzocyclobutene-based resin can be used. Other than such organic materials, it is also possible to use a low-dielectric constant material (a low-k material) or the like. Note that the planarization insulating film may be formed by stacking a plurality of insulating films formed from these materials.

Next, opening portions reaching the source electrode layer 405a and the drain electrode layer 405b are formed in the insulating film 407, and a wiring layer electrically connected to the source electrode layer 405a or the drain electrode layer 405b is formed in the opening portions. With use of this wiring layer, the transistor 510 is connected to another transistor, which can lead to formation of a variety of circuits.

The technical feature of the transistor described in this embodiment is to include an oxide semiconductor stack in which oxide semiconductors with different energy gaps are stacked, and to have, in the oxide semiconductor stack, a region which contains oxygen in excess of its stoichiometry. Thus, introduction of an impurity into the oxide semiconductor stack 403 is not necessarily performed. For example, in the manufacturing process illustrated in FIGS. 2A to 2D, after the gate electrode layer 401 is formed, an impurity is not introduced, and the insulating film 407 is formed over the gate insulating film 402 and the gate electrode layer 401. As a result, a transistor 520 illustrated in FIG. 3 can be formed.

Figure 3:
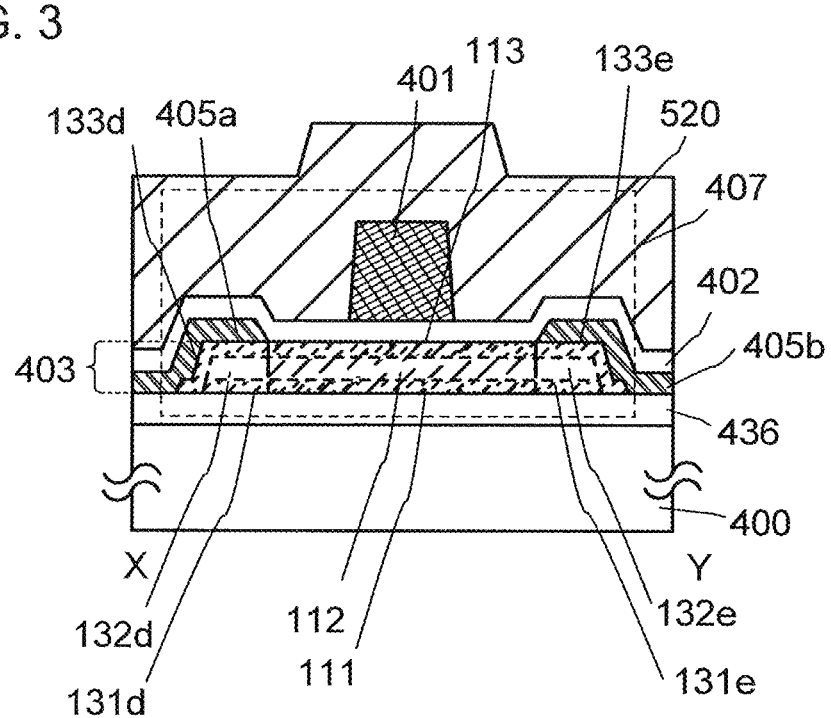
FIG. 3 is a cross-sectional view illustrating a semiconductor device according to one embodiment of the present invention.

The transistor 520 illustrated in FIG. 3 includes, over the substrate 400 which is provided with the oxide insulating film 436 to have an insulating surface, the oxide semiconductor stack 403 including a first oxide semiconductor layer, a second oxide semiconductor layer, and a third oxide semiconductor layer, the source electrode layer 405a, the drain electrode layer 405b, the gate insulating film 402, and the gate electrode layer 401 overlapping with the oxide semiconductor stack 403 with the gate insulating film 402 positioned therebetween.

In the transistor 520, the oxide semiconductor stack 403 has: a first oxygen-excess region 111, a second oxygen-excess region 112, and a third oxygen-excess region 113, which are formed in a self-aligned manner with use of the source electrode layer 405a and the drain electrode layer 405b as masks; and first regions 131d and 131e, second regions 132d and 132e, and third regions 133d and 133e, which overlap with the source electrode layer 405a or the drain electrode layer 405b.

The portions which overlap with neither the source electrode layer 405a nor the drain electrode layer 405b (the first oxygen-excess region 111, the second oxygen-excess region 112, and the third oxygen-excess region 113) have a higher oxygen concentration than the portions which overlap with the source electrode layer 405a and the drain electrode layer 405b (the first regions 131d and 131e, the second regions 132d and 132e, and the third regions 133d and 133e). However, composition elements in the both portions are same.

The oxide semiconductor stack 403 used in the transistor 510 or the transistor 520 is highly purified, and oxygen vacancies therein are filled; impurities such as hydrogen or water therein are sufficiently removed. The hydrogen concentration in the oxide semiconductor stack 403 is lower than or equal to $5\times10^{19}/cm^3$, preferably lower than or equal to $5\times10^{18}/cm^3$. Note that the concentration of hydrogen in the oxide semiconductor stack 403 is measured by secondary ion mass spectrometry (SIMS).

In the case of the transistor using the highly purified oxide semiconductor stack 403 containing an excess of oxygen that fills oxygen vacancies according to this embodiment, the current value in the off state (off-state current value) can be reduced to a value less than or equal to 100 zA per micrometer of channel width at room temperature (1 zA (zeptoampere)=$1\times10^{-21}$ A), preferably less than or equal to 10 zA/μm, further preferably less than or equal to 1 zA/μm, still further preferably less than or equal to 100 yA/μm.

Further, in each of the transistor 510 and the transistor 520 described in this embodiment, the third oxide semiconductor layer is formed to cover the side surfaces of the first oxide semiconductor layer and side surfaces of the second oxide semiconductor layer. With such a structure, an increase in oxygen vacancies in the second oxide semiconductor layer is suppressed, and the threshold voltage of the transistor can be close to zero. Furthermore, the second oxide semiconductor layer serves as a buried channel, which results in a decrease in carrier scattering. As a result, high field-effect mobility can be achieved.

With a structure in which the second oxide semiconductor layer with a small energy gap is sandwiched between the first oxide semiconductor layer and the third oxide semiconductor layer with large energy gaps, the off-state current (leakage current) of the transistor can be reduced.

With use of the thus obtained transistor having excellent electric characteristics, a semiconductor device with high performance and high reliability can be provided.

The methods and structures described in this embodiment can be combined as appropriate with any of the methods and structures described in the other embodiments.

Embodiment 2

In this embodiment, examples of transistors formed by the manufacturing process, part of which is changed, described in Embodiment 1 will be described with reference to FIGS. 4A to 4E. The transistors described in this embodiment are just partly different from those in Embodiment 1; thus the same reference numerals are used to denote the same portions for simplification, and detailed description of the same portion is omitted in this embodiment.

Figure 4A:
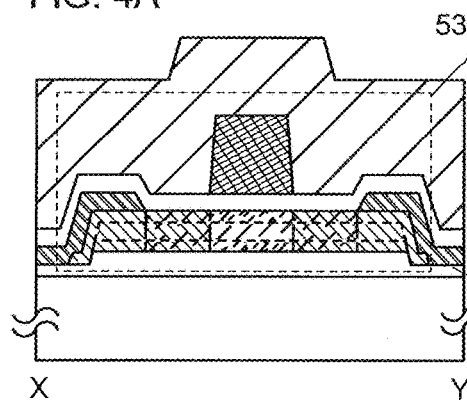
FIGS. 4A to 4E are cross-sectional views each illustrating a semiconductor device according to one embodiment of the present invention.

A transistor 530 illustrated in FIG. 4A has a structure in which part of the oxide insulating film 436 is etched to be thin with use of a mask which is used for processing the first oxide semiconductor layer and the second oxide semiconductor layer to have an island shape (or with use of the first island-shaped oxide semiconductor layer and the second island-shaped oxide semiconductor layer which are manufactured by the processing, as a mask). In the transistor 530, a region in the oxide insulating film 436, which overlaps with the first and second island-shaped oxide semiconductor layers, has a larger thickness than the other region in the oxide insulating film 436, which does not overlap with the first and second island-shaped oxide semiconductor layers. When part of the oxide insulating film 436 is etched at the time of processing the first oxide semiconductor layer and the second oxide semiconductor layer to have an island shape, an etching residue of the first oxide semiconductor layer or the like is removed, so that generation of leakage current can be reduced.

Figure 4B:
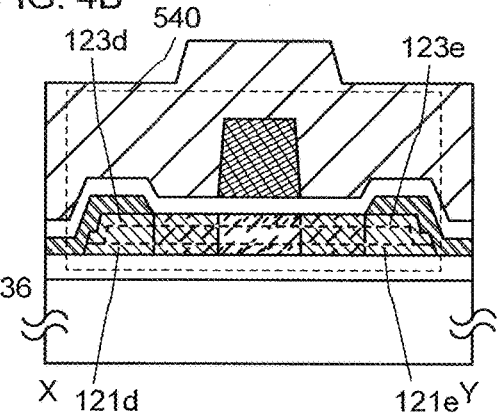

A transistor 540 illustrated in FIG. 4B has a structure in which the oxide semiconductor stack 403 is formed by performing photolithography three times. The oxide semiconductor stack 403 included in the transistor 540 is formed as follows: after a first oxide semiconductor layer is formed, the first oxide semiconductor layer is processed to have an island shape with use of a first mask; a second oxide semiconductor layer is formed over the first island-shaped oxide semiconductor layer; the second oxide semiconductor layer is processed to have an island shape with use of a second mask; a third oxide semiconductor layer is formed over the first and second island-shaped oxide semiconductor layers; and the third oxide semiconductor layer is processed to have an island shape with use of a third mask.

Note that the transistor 540 has a structure in which a side surface of the first oxide semiconductor layer extends beyond a side surface of the second oxide semiconductor layer, and the third oxide semiconductor layer is in contact with part of a top surface of the first oxide semiconductor layer. The third regions 123d and 123e corresponding to end portions of the third oxide semiconductor layer are in contact with and overlap with the first regions 121d and 121e corresponding to end portions of the first oxide semiconductor layer.

Figure 4C:
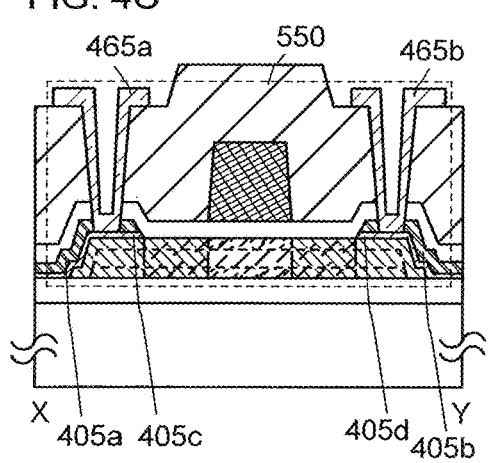

A transistor 550 illustrated in FIG. 4C has a structure in which a source electrode layer has a stacked structure of a source electrode layer 405c and the source electrode layer 405a, a drain electrode layer has a stacked structure of a drain electrode layer 405d and the drain electrode layer 405b, and a wiring layer 465a and a wiring layer 465b are formed to reach the source electrode layer 405c and the drain electrode layer 405d which are lower layers of the source electrode layer and the drain electrode layer. By an etching step for forming contact holes in the insulating film 407, part of the source electrode layer 405a or the drain electrode layer 405b is over-etched and removed in some cases. In the transistor 550, the source electrode layer and the drain electrode layer each have a stacked layer structure, and a conductive layer which is a lower layer can serve as an etching stopper.

In the transistor 550 in this embodiment, as the source electrode layer 405c and the drain electrode layer 405d which are lower layers, a tungsten film or a tantalum nitride film is used, and as the source electrode layer 405a and the drain electrode layer 405b which are upper layers thicker than the lower layers, a copper film or an aluminum film is used. The thicknesses of the source electrode layer 405a and the drain electrode layer 405b in FIG. 4C are greater than or equal to 5 nm and less than or equal to 15 nm, whereby coverage with the gate insulating film 402 formed thereover can be favorable. Note that in this embodiment, the wiring layer 465a and the wiring layer 465b each have a stacked structure of a tantalum nitride film and a copper film or a stacked structure of a tantalum nitride film and a tungsten film, whereby the contact resistance can be achieved.

Figure 4D:
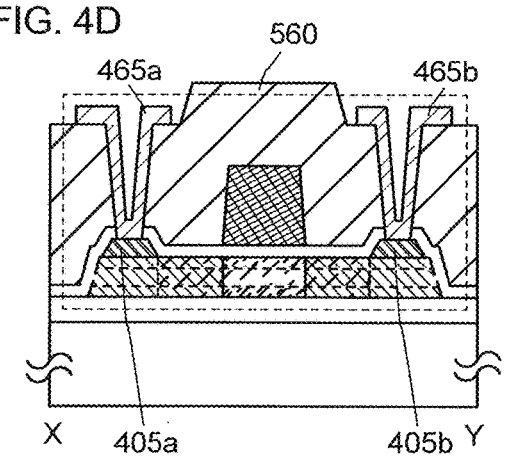

A transistor 560 illustrated in FIG. 4D has a structure in which a first oxide semiconductor layer, a second oxide semiconductor layer, and a third oxide semiconductor layer are processed by performing a photolithography step once with use of one mask, so that the oxide semiconductor stack 403 is formed. In the oxide semiconductor stack 403 included in the transistor 560, an end portion of the first oxide semiconductor layer, an end portion of the second oxide semiconductor layer, and an end portion of the third oxide semiconductor layer are aligned; the three oxide semiconductor layers have the same shape. In other words, in the oxide semiconductor stack 403, side surfaces (end portions) of the first oxide semiconductor layer and side surfaces (end portions) of the second oxide semiconductor layer are exposed.

Formation of the oxide semiconductor stack 403 by performing a photolithography step once makes it possible to reduce the number of steps, and thus, manufacturing cost of a semiconductor device can be reduced. Note that in the transistor 560, when the source electrode layer 405a and the drain electrode layer 405b are formed over the third oxide semiconductor layer to be in contact with only a top surface of the third oxide semiconductor layer or to be in contact with only a top surface and a side surface of the third oxide semiconductor layer, a structure in which the source electrode layer 405a and the drain electrode layer 405b are not in contact with the side surface of the second oxide semiconductor layer can be formed. Such a structure is preferable because generation of leakage current between the source electrode layer and the drain electrode layer (parasitic channel) of the transistor can be reduced.

The oxide semiconductor stack 403 does not necessarily have a three-layer structure. For example, a transistor 570 illustrated in FIG. 4E includes the oxide semiconductor stack 403 with a two-layer structure of a first oxide semiconductor layer and a second oxide semiconductor layer. In the transistor 570, the second oxide semiconductor layer overlaps with the first oxide semiconductor layer and has a larger area than the first oxide semiconductor layer, thereby being formed to cover the first oxide semiconductor layer. With such a structure, an increase of oxygen vacancies in the first oxide semiconductor layer can be suppressed, and the threshold voltage of the transistor can be close to zero. Note that in the transistor 570, an aluminum oxide film is formed as the oxide insulating film 436, whereby oxygen can be prevented from being released to an insulating film in contact with the first oxide semiconductor layer, which is preferable.

Figure 4E:
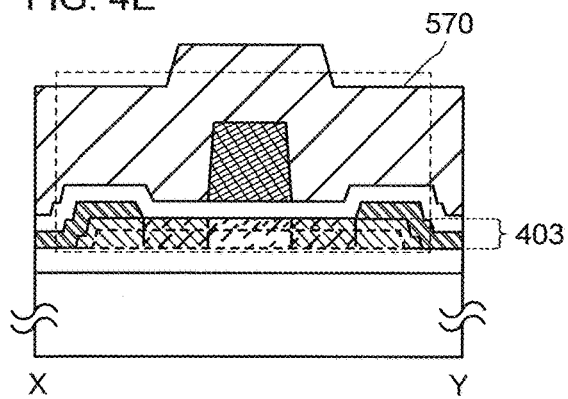

In the transistor 570 illustrated in FIG. 4E, the source electrode layer 405a or the drain electrode layer 405b formed over and in contact with the second oxide semiconductor layer is not in contact with the side surfaces of the first oxide semiconductor layer. Such a structure is preferable because generation of leakage current between the source electrode layer 405a and the drain electrode layer 405b (parasitic channel) can be reduced.

The methods and structures described in this embodiment can be combined as appropriate with any of the methods and structures described in the other embodiments.

Embodiment 3

A semiconductor device having a display function (also referred to as a display device) can be manufactured using any of the transistors described in Embodiment 1 or Embodiment 2. Moreover, some or all of the driver circuits which include the transistors can be formed over a substrate where the pixel portion is formed, whereby a system-on-panel can be obtained.

Figure 5A:
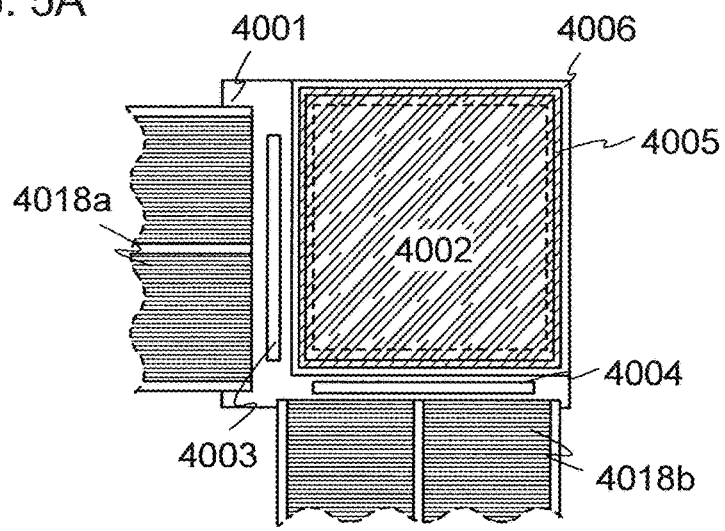
FIGS. 5A to 5C each illustrate a semiconductor device according to one embodiment of the present invention.

In FIG. 5A, a sealant 4005 is provided so as to surround a pixel portion 4002 provided over a first substrate 4001, and the pixel portion 4002 is sealed between the first substrate 4001 and the second substrate 4006. In FIG. 5A, a signal line driver circuit 4003 and a scan line driver circuit 4004 which are formed using a single crystal semiconductor film or a polycrystalline semiconductor film over a substrate separately prepared are mounted in a region that is different from the region surrounded by the sealant 4005 over the first substrate 4001. Various signals and potential are supplied to the signal line driver circuit 4003 and the scan line driver circuit 4004 each of which is separately formed, and the pixel portion 4002 from flexible printed circuits (FPCs) 4018a and 4018b.

Figure 5B:
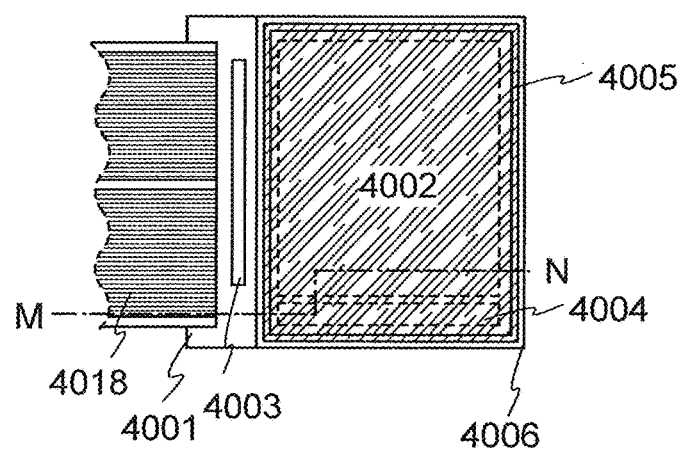
Figure 5C:
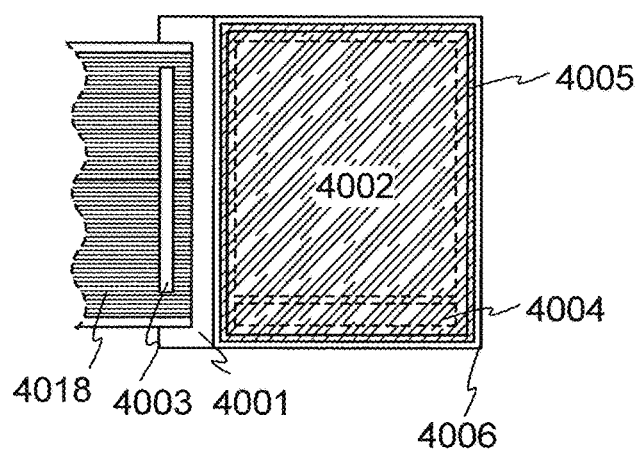

In FIGS. 5B and 5C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with the display element, by the first substrate 4001, the sealant 4005, and the second substrate 4006. In FIGS. 5B and 5C, the signal line driver circuit 4003 which is formed using a single crystal semiconductor film or a polycrystalline semiconductor film over a substrate separately prepared is mounted in a region that is different from the region surrounded by the sealant 4005 over the first substrate 4001. In FIGS. 5B and 5C, various signals and potential are supplied to the signal line driver circuit 4003 which is separately formed, the scan line driver circuit 4004, and the pixel portion 4002 from an FPC 4018.

Although FIGS. 5B and 5C each illustrate an example in which the signal line driver circuit 4003 is formed separately and mounted on the first substrate 4001, the display device according to the present invention is not limited to this structure. The scan line driver circuit may be formed separately and then mounted, or only part of the signal line driver circuit or part of the scan line driver circuit may be formed separately and then mounted.

Note that a connection method of a separately formed driver circuit is not particularly limited, and a chip on glass (COG) method, a wire bonding method, a tape automated bonding (TAB) method or the like can be used. FIG. 5A illustrates an example in which the signal line driver circuit 4003 and the scan line driver circuit 4004 are mounted by a COG method. FIG. 5B illustrates an example in which the signal line driver circuit 4003 is mounted by a COG method. FIG. 5C illustrates an example in which the signal line driver circuit 4003 is mounted by a TAB method.

Further, a display device includes a panel in which a display element is sealed, and a module in which an IC or the like including a controller is mounted to the panel.

Note that a display device in this specification means an image display device, a display device, or a light source (including a lighting device). Furthermore, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion and the scan line driver circuit provided over the first substrate include a plurality of transistors, and any of the transistors which is described in Embodiment 1 or Embodiment 2 can be applied thereto.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

Embodiments of the semiconductor device will be described with reference to FIGS. 5A to 5C and FIGS. 6A and 6B. FIGS. 6A and 6B are cross-sectional views along line M-N in FIG. 5B.

As illustrated in FIGS. 6A and 6B, the semiconductor device includes a connection terminal electrode 4015 and a terminal electrode 4016, and the connection terminal electrode 4015 and the terminal electrode 4016 are electrically connected to a terminal included in the FPC 4018 through an anisotropic conductive film 4019.

The connection terminal electrode 4015 is formed using the same conductive film as a first electrode layer 4030, and the terminal electrode 4016 is formed using the same conductive film as source and drain electrode layers of transistors 4040, 4010, and 4011.

The pixel portion 4002 and the scan line driver circuit 4004 provided over the first substrate 4001 include a plurality of transistors. FIG. 6A illustrates the transistor 4040 included in the pixel portion 4002 and the transistor 4011 included in the scan line driver circuit 4004, as an example. FIG. 6B illustrates the transistor 4010 included in the pixel portion 4002 and the transistor 4011 included in the scan line driver circuit 4004. In FIG. 6A, an insulating film 4020 is provided over the transistors 4040 and 4011, and in FIG. 6B, 20 insulating films 4020 and 4021 are provided over the transistors 4010 and 4011. Note that an insulating film 4023 is an insulating film functioning as a base film.

As the transistor 4011 included in the scan line driver circuit 4004, any of the transistors having a buried channel described in Embodiment 1 or Embodiment 2 can be used. The transistor having a buried channel has excellent on characteristics (e.g., on-state current and filed-effect mobility), which enables high-speed operation and high-speed response of the scan line driver circuit 4004. Described in this embodiment is an example in which a transistor having a structure similar to that of the transistor described in Embodiment 1 is used.

Each of the transistors 4010 and 4040 included in the pixel portion 4002 is electrically connected to a display element to form a display panel. There is no particular limitation on the kind of the display element as long as display can be performed, and various kinds of display elements can be employed.

A buried channel is not necessarily provided for the transistor 4040 included in the pixel portion 4002; thus, the transistor 4040 in which a single layer of an oxide semiconductor layer is used for a channel formation region is provided. The transistor 4040 can be manufactured through the same steps as the transistor 4011 without an increase in the number of manufacturing steps. An oxide semiconductor layer of the transistor 4040 can be formed through the same steps as the third oxide semiconductor layer of the transistor 4011. In the case where the display device does not have a large size, the transistor 4040 does not particularly need to have improved on characteristics. With a single oxide semiconductor layer, the off-state current of the transistor 4040 can be smaller than that of the transistor 4011, whereby a display device with low power consumption can be obtained.

An example of a liquid crystal display device using a liquid crystal element as a display element is illustrated in FIG. 6A. In FIG. 6A, a liquid crystal element 4013 which is a display element includes the first electrode layer 4030, the second electrode layer 4031, and a liquid crystal layer 4008. Insulating films 4032 and 4033 serving as alignment films are provided so that the liquid crystal layer 4008 is interposed therebetween. The second electrode layer 4031 is provided on the second substrate 4006 side, and the first electrode layer 4030 and the second electrode layer 4031 are stacked, with the liquid crystal layer 4008 interposed therebetween.

A columnar spacer denoted by reference numeral 4035 is obtained by selective etching of an insulating film and is provided in order to control the thickness (a cell gap) of the liquid crystal layer 4008. Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material (liquid crystal composition) exhibits a cholesteric phase, a smectic phase, a cubic phase, a chiral nematic phase, an isotropic phase, or the like depending on conditions.

Alternatively, a liquid crystal composition exhibiting a blue phase for which an alignment film is unnecessary may be used for the liquid crystal layer 4008. A blue phase is one of liquid crystal phases, which is generated just before a cholesteric phase changes into an isotropic phase while temperature of cholesteric liquid crystal is increased. The blue phase can be exhibited using a liquid crystal composition which is a mixture of a liquid crystal and a chiral agent. In order to increase the temperature range where the blue phase is exhibited, a liquid crystal layer may be formed by adding a polymerizable monomer, a polymerization initiator, and the like to a liquid crystal composition capable of exhibiting a blue phase and by performing polymer stabilization treatment. The liquid crystal composition exhibiting a blue phase has a short response time, and has optical isotropy, which contributes to the exclusion of the alignment process and reduction of viewing angle dependence. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased. A transistor including an oxide semiconductor film has a possibility that the electric characteristics of the transistor may vary significantly by the influence of static electricity and deviate from the designed range. Therefore, it is more effective to use a liquid crystal composition exhibiting a blue phase for the liquid crystal display device including the transistor that includes the oxide semiconductor film.

The specific resistivity of the liquid crystal material is higher than or equal to $1 \times 10^9$ Ω·cm, preferably higher than or equal to $1 \times 10^{11}$ Ω·cm, further preferably higher than or equal to $1 \times 10^{12}$ Ω·cm. Note that the specific resistivity in this specification is measured at 20° C.

The size of storage capacitor formed in the liquid crystal display device is set considering the leakage current of the transistor provided in the pixel portion or the like so that charge can be held for a predetermined period. The size of the storage capacitor may be set considering the off-state current of a transistor or the like. By using the transistor including the oxide semiconductor film disclosed in this specification, it is enough to provide a storage capacitor having capacitance that is ⅓ or less, preferably ⅕ or less of liquid crystal capacitance of each pixel.

In the transistor 4040 including the oxide semiconductor film disclosed in this specification, the current in an off state (off-state current) can be controlled to be small. Accordingly, an electrical signal such as an image signal can be held for a longer period in the pixel, and a writing interval can be set longer in an on state. Accordingly, frequency of refresh operation can be reduced, which leads to an effect of suppressing power consumption.

Further, in the transistor 4011 including the oxide semiconductor film disclosed in this specification, the field-effect mobility can be controlled to be high; thus, the scan line driver circuit 4004 can drive at high speed. According to this embodiment, a switching transistor in a pixel portion and a driver transistor in a driver circuit portion can be formed over one substrate. That is, since a semiconductor device formed using a silicon wafer or the like is not additionally needed for a driver circuit, the number of components of the semiconductor device can be reduced.

In addition, a transistor including the same stack of oxide semiconductor layers as the transistor 4011 may be used for a pixel portion. By using a transistor which can operate at high speed in the pixel portion, a high-quality image or a large-sized display can also be provided.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode is preferable. Some examples are given as the vertical alignment mode. For example, a multi-domain vertical alignment (MVA) mode, a patterned vertical alignment (PVA) mode, an Advanced Super View (ASV) mode, and the like can be used. Furthermore, this embodiment can be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method or the like can be employed. Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. Note that the disclosed invention is not limited to the application to a display device for color display; the disclosed invention can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element. Note that an example of an organic EL element as a light-emitting element is described here.

In order to extract light emitted from the light-emitting element, it is acceptable as long as at least one of a pair of electrodes has a light-transmitting property. A transistor and a light-emitting element are formed over a substrate. The light-emitting element can have a top emission structure in which light emission is extracted through the surface opposite to the substrate; a bottom emission structure in which light emission is extracted through the surface on the substrate side; or a dual emission structure in which light emission is extracted through the surface opposite to the substrate and the surface on the substrate side, and a light-emitting element having any of these emission structures can be used.

An example of a light-emitting device in which a light-emitting element is used as a display element is illustrated in FIG. 6B. A light-emitting element 4513 which is a display element is electrically connected to the transistor 4010 provided in the pixel portion 4002. A structure of the light-emitting element 4513 is not limited to the stacked-layer structure including the first electrode layer 4030, an electroluminescent layer 4511, and the second electrode layer 4031. The structure of the light-emitting element 4513 can be changed as appropriate depending on a direction in which light is extracted from the light-emitting element 4513, or the like.

A partition wall 4510 can be formed using an organic insulating material or an inorganic insulating material. It is particularly preferable that the partition wall 4510 be formed using a photosensitive resin material to have an opening portion over the first electrode layer 4030 so that a sidewall of the opening portion is formed as a tilted surface with continuous curvature.

The electroluminescent layer 4511 may be formed using either a single layer or a plurality of layers stacked.

A protective film may be formed over the second electrode layer 4031 and the partition wall 4510 in order to prevent entry of oxygen, hydrogen, moisture, carbon dioxide, or the like into the light-emitting element 4513. As the protective film, a silicon nitride film, a silicon nitride oxide film, a DLC film, or the like can be formed.

Further, a layer containing an organic compound may be deposited by a deposition method to cover the light-emitting element 4513 so that oxygen, hydrogen, moisture, carbon dioxide, and the like do not enter the light-emitting element 4513.

In addition, in a space which is formed with the first substrate 4001, the second substrate 4006, and the sealant 4005, a filler 4514 is provided for sealing. It is preferable that a panel be packaged (sealed) with a protective film (such as a laminate film or an ultraviolet curable resin film) or a cover material with high air-tightness and little degasification so that the panel is not exposed to the outside air, in this manner.

As the filler 4514, an ultraviolet curable resin or a thermosetting resin can be used as well as an inert gas such as nitrogen or argon. For example, polyvinyl chloride (PVC), an acrylic resin, a polyimide resin, an epoxy resin, a silicone resin, polyvinyl butyral (PVB), or ethylene vinyl acetate (EVA) can be used. For example, nitrogen is used for the filler.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Further, an electronic paper in which electronic ink is driven can be provided as the display device. The electronic paper is also referred to as an electrophoretic display device (an electrophoretic display) and is advantageous in that it has the same level of readability as plain paper, it has lower power consumption than other display devices, and it can be made thin and lightweight.

An electrophoretic display device can have various modes. An electrophoretic display device contains a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display device is a display device that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

In FIGS. 5A to 5C and FIGS. 6A and 6B, as the first substrate 4001 and the second substrate 4006, flexible substrates, for example, plastic substrates having a light-transmitting property or the like can be used, in addition to glass substrates. As plastic, a fiberglass-reinforced plastics (FRP) plate, a polyvinyl fluoride (PVF) film, a polyester film, or an acrylic resin film can be used. In the case where a light-transmitting property is not needed, a metal substrate (metal film) of aluminum, stainless steel, or the like may be used. For example, a sheet with a structure in which an aluminum foil is sandwiched between PVF films or polyester films may be used.

In this embodiment, an aluminum oxide film is used as the insulating film 4020.

The aluminum oxide film provided as the insulating film 4020 over an oxide semiconductor film has a superior shielding effect (blocking effect), which is not permeable to either oxygen or impurities such as hydrogen or moisture.

Therefore, during the manufacturing process and after the manufacture, the aluminum oxide film functions as a protective film for preventing entry of an impurity such as hydrogen or moisture, which can cause a change, into the oxide semiconductor film and release of oxygen, which is a main component material of the oxide semiconductor, from the oxide semiconductor film.

The insulating film 4021 serving as a planarizing insulating film can be formed using an organic material having heat resistance, such as an acrylic resin, a polyimide resin, a benzocyclobutene-based resin, a polyamide resin, or an epoxy resin. Other than such organic materials, it is also possible to use a low-dielectric constant material (a low-k material), a siloxane-based resin, PSG (phosphosilicate glass), BPSG (borophosphosilicate glass), or the like. The insulating film may be formed by stacking a plurality of insulating films formed of these materials.

The first electrode layer and the second electrode layer (each of which may be called a pixel electrode layer, a common electrode layer, a counter electrode layer, or the like) for applying voltage to the display element may have light-transmitting properties or light-reflecting properties, which depends on the direction in which light is extracted, the position where the electrode layer is provided, the pattern structure of the electrode layer, and the like.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or graphene.

The first electrode layer 4030 and the second electrode layer 4031 each can be formed using one kind or plural kinds selected from metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a nitride thereof.

Since the transistor is easily broken owing to static electricity or the like, a protective circuit for protecting the driver circuit is preferably provided. The protection circuit is preferably formed using a nonlinear element.

By using any of the transistors described in Embodiment 1 or Embodiment 2 as described above, the semiconductor device can have a variety of functions.

Embodiment 4

A semiconductor device having an image sensor function of reading information on an object can be formed with use of the transistor described in Embodiment 1 or Embodiment 2.

Figure 7A:
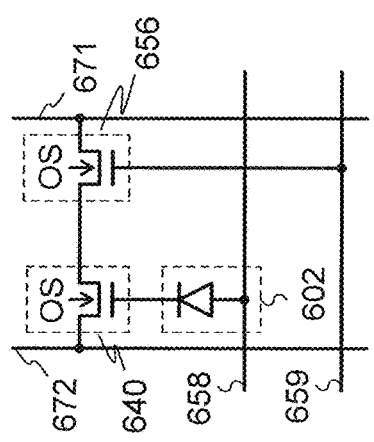
FIGS. 7A and 7B illustrate a semiconductor device according to one embodiment of the present invention.

An example of a semiconductor device having an image sensor function is illustrated in FIG. 7A. FIG. 7A is an equivalent circuit diagram of a photo sensor, and FIG. 7B is a cross-sectional view illustrating part of the photo sensor.

In a photodiode 602, one electrode is electrically connected to a photodiode reset signal line 658, and the other electrode is electrically connected to a gate of a transistor 640. One of a source and a drain of the transistor 640 is electrically connected to a photo sensor reference signal line 672, and the other of the source and the drain thereof is electrically connected to one of a source and a drain of a transistor 656. A gate of the transistor 656 is electrically connected to a gate signal line 659, and the other of the source and the drain thereof is electrically connected to a photo sensor output signal line 671.

Note that in circuit diagrams in this specification, a transistor including an oxide semiconductor film is denoted by a symbol "OS" so that it can be identified as a transistor including an oxide semiconductor film. As each of the transistor 640 and the transistor 656 in FIG. 7A, any of the transistors described in Embodiment 1 or Embodiment 2 can be employed, which is a transistor including an oxide semiconductor stack. Described in this embodiment is an example in which a transistor having a structure similar to that of the transistor described in Embodiment 1 is used.

Figure 7B:
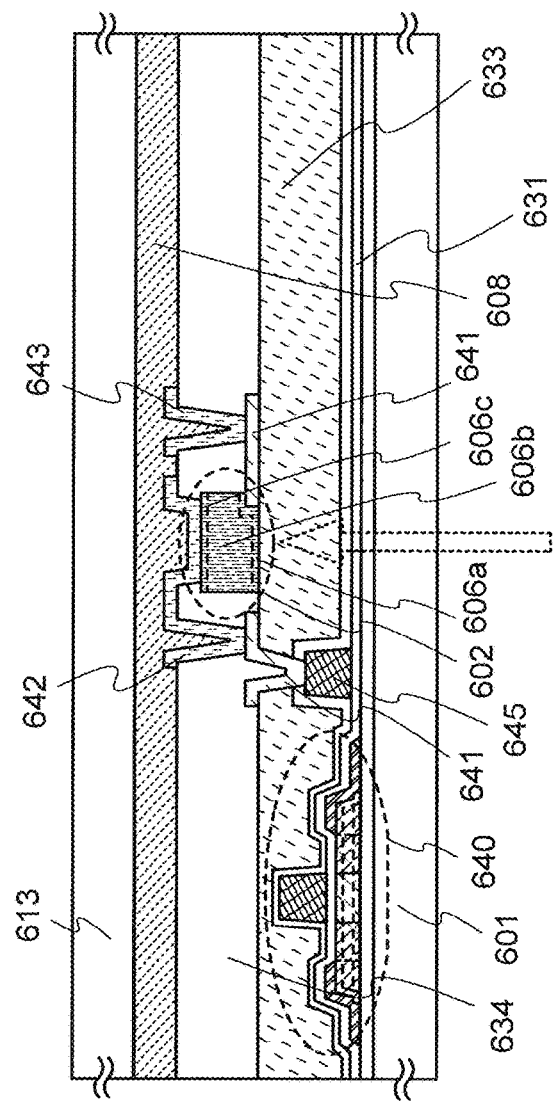

FIG. 7B is a cross-sectional view of the photodiode 602 and the transistor 640 in the photo sensor. The photodiode 602 functioning as a sensor and the transistor 640 are provided over a substrate 601 (a TFT substrate) having an insulating surface. A substrate 613 is provided over the photodiode 602 and the transistor 640 with an adhesive layer 608 interposed therebetween.

An insulating film 631, an insulating film 632, an interlayer insulating film 633, and an interlayer insulating film 634 are provided over the transistor 640. The photodiode 602 is provided over the interlayer insulating film 633. In the photodiode 602, a semiconductor film 606a, a semiconductor film 606b, and a third semiconductor film 606c are sequentially stacked from the interlayer insulating film 633 side, between the electrode layer 641 formed over the interlayer insulating film 633 and the electrode layer 642 formed over the interlayer insulating film 634.

The electrode layer 641 is electrically connected to a conductive layer 643 provided for the interlayer insulating film 634, and the electrode layer 642 is electrically connected to a conductive layer 645 through the electrode layer 641. The conductive layer 645 is electrically connected to a gate electrode layer of the transistor 640, and the photodiode 602 is electrically connected to the transistor 640.

Here, a pin photodiode in which a semiconductor film having p-type conductivity as the first semiconductor film 606a, a high-resistance semiconductor film (i-type semiconductor film) as the second semiconductor film 606b, and a semiconductor film having n-type conductivity as the third semiconductor film 606c are stacked is illustrated as an example.

The first semiconductor film 606a is a p-type semiconductor film and can be formed using an amorphous silicon film containing an impurity element imparting p-type conductivity. The first semiconductor film 606a is formed by a plasma CVD method with use of a semiconductor source gas containing an impurity element belonging to Group 13 (e.g., boron (B)). As the semiconductor material gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film with use of a diffusion method or an ion injecting method. Heating or the like may be conducted after introducing the impurity element by an ion implantation method or the like in order to diffuse the impurity element. In this case, as a method of forming the amorphous silicon film, an LPCVD method, a chemical vapor deposition method, a sputtering method, or the like may be used. The first semiconductor film 606a is preferably formed to have a thickness greater than or equal to 10 nm and less than or equal to 50 nm.

The second semiconductor film 606b is an i-type semiconductor film (intrinsic semiconductor film) and is formed using an amorphous silicon film. As for formation of the second semiconductor film 606b, an amorphous silicon film is formed by a plasma CVD method with use of a semiconductor source gas. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The second semiconductor film 606b may be formed by an LPCVD method, a vapor deposition method, a sputtering method, or the like. The second semiconductor film 606b is preferably formed to have a thickness greater than or equal to 200 nm and less than or equal to 1000 nm.

The third semiconductor film 606c is an n-type semiconductor film and is formed using an amorphous silicon film containing an impurity element imparting n-type conductivity. The third semiconductor film 606c is formed by a plasma CVD method with use of a semiconductor source gas containing an impurity element belonging to Group 15 (e.g., phosphorus (P)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film with use of a diffusion method or an ion implantation method. Heating or the like may be conducted after introducing the impurity element by an ion implantation method or the like in order to diffuse the impurity element. In this case, as a method for forming the amorphous silicon film, an LPCVD method, a chemical vapor deposition method, a sputtering method, or the like may be used. The third semiconductor film 606c is preferably formed to have a thickness greater than or equal to 20 nm and less than or equal to 200 nm.

The first semiconductor film 606a, the second semiconductor film 606b, and the third semiconductor film 606c are not necessarily an amorphous semiconductor, but may be a polycrystalline semiconductor or a microcrystalline semiconductor (semi-amorphous semiconductor: SAS).

In addition, the mobility of holes generated by the photoelectric effect is lower than the mobility of electrons. Therefore, a pin photodiode has better characteristics when a surface on the p-type semiconductor film side is used as a light-receiving plane. Here, an example in which light received by the photodiode 602 from a surface of the substrate 601, over which the pin photodiode is formed, is converted into electric signals is described. Further, light from the semiconductor film having a conductivity type opposite to that of the semiconductor film on the light-receiving plane is disturbance light; therefore, the electrode layer is preferably formed using a light-blocking conductive film. Note that the n-type semiconductor film side may alternatively be a light-receiving plane.

With use of an insulating material, the insulating film 632, the interlayer insulating film 633, and the interlayer insulating film 634 can be formed, depending on the material, use of a method or a tool (equipment) such as a sputtering method, a plasma CVD method, an SOG method, spin coating, dipping, spray coating, a droplet discharge method (such as an inkjet method), a printing method (such as screen printing or offset printing), a doctor knife, a roll coater, a curtain coater, or a knife coater.

In this embodiment, an aluminum oxide film is used as the insulating film 631. The insulating film 631 can be formed by a sputtering method or a plasma CVD method.

The aluminum oxide film provided as the insulating film 631 over the oxide semiconductor film has a superior shielding effect (blocking effect), which is not permeable to either oxygen or impurities such as hydrogen or moisture.

Therefore, during the manufacturing process and after the manufacture, the aluminum oxide film functions as a protective film for preventing entry of an impurity such as hydrogen or moisture, which might cause variation in characteristics, into the oxide semiconductor film, and release of oxygen, which is a main component material of the oxide semiconductor, from the oxide semiconductor film.

The insulating film 632 can be formed using an inorganic insulating material and can have a single-layer structure or a stacked-layer structure including any of oxide insulating films such as a silicon oxide layer, a silicon oxynitride layer, an aluminum oxide layer, and an aluminum oxynitride layer; and nitride insulating films such as a silicon nitride layer, a silicon nitride oxide layer, an aluminum nitride layer, and an aluminum nitride oxide layer.

For a reduction in surface roughness, an insulating film functioning as a planarization insulating film is preferably used as each of the interlayer insulating films 633 and 634. For the interlayer insulating films 633 and 634, for example, an organic insulating material having heat resistance, such as a polyimide resin, an acrylic resin, a benzocyclobutene-based resin, a polyamide resin, or an epoxy resin, can be used. Other than such organic insulating materials, it is possible to use a single layer or stacked layers of a low-dielectric constant material (a low-k material), a siloxane-based resin, phosphosilicate glass (PSG), borophosphosilicate glass (BPSG), or the like.

With detection of light that enters the photodiode 602, data on an object to be detected can be read. Note that a light source such as a backlight can be used at the time of reading data on an object.

As described above, with use of the oxide semiconductor stack including a buried channel, electric characteristics of the transistor can be controlled accurately, and desired electric characteristics can be given to the transistor. Therefore, with use of such a transistor, a semiconductor device which meets various purposes such as high performance, high reliability, and low power consumption can be provided.

This embodiment can be implemented in appropriate combination with the structures described in the other embodiments.

Embodiment 5

A semiconductor device disclosed in this specification can be applied to a variety of electronic devices (including game machines). Examples of electronic devices to which the present invention can be applied include a television set (also referred to as a television or a television receiver), a monitor of a computer, cameras such as a digital camera and a digital video camera, a digital photo frame, a mobile phone, a portable game machine, a portable information terminal, an audio reproducing device, a game machine (e.g., a pachinko machine or a slot machine), a housing of a game machine, and the like. Specific examples of such electronic devices are illustrated in FIGS. 8A to 8D.

Figure 8A:
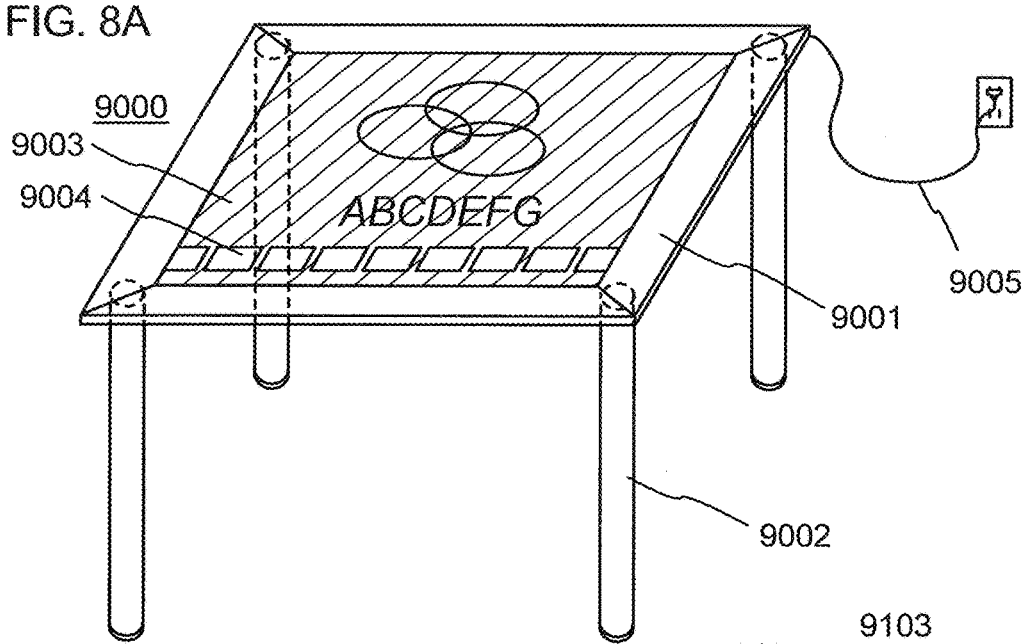
FIGS. 8A to 8D each illustrate an electronic device.

FIG. 8A illustrates a table 9000 having a display portion. In the table 9000, a display portion 9003 is incorporated into a housing 9001. A semiconductor device manufactured according to one embodiment of the present invention can be used for the display portion 9003, and an image can be displayed on the display portion 9003. Note that the housing 9001 is supported by four leg portions 9002. Further, a power cord 9005 for supplying power is provided for the housing 9001.

The display portion 9003 has a touch-input function. When a user touches displayed buttons 9004 which are displayed on the display portion 9003 of the table 9000 with his/her fingers or the like, the user can carry out operation of the screen and input of information. Further, when the table may be made to communicate with home appliances or control the home appliances, the display portion 9003 may function as a control device which controls the home appliances by operation on the screen. For example, with use of the semiconductor device having an image sensor described in Embodiment 3, the display portion 9003 can function as a touch panel.

Further, the screen of the display portion 9003 can be placed perpendicular to a floor with a hinge provided for the housing 9001; thus, the table 9000 can also be used as a television set. A television set with a large screen takes up too much space that is available in a small room. However, with a table having a display portion therein, it is possible to make the use of the space in the room.

Figure 8B:
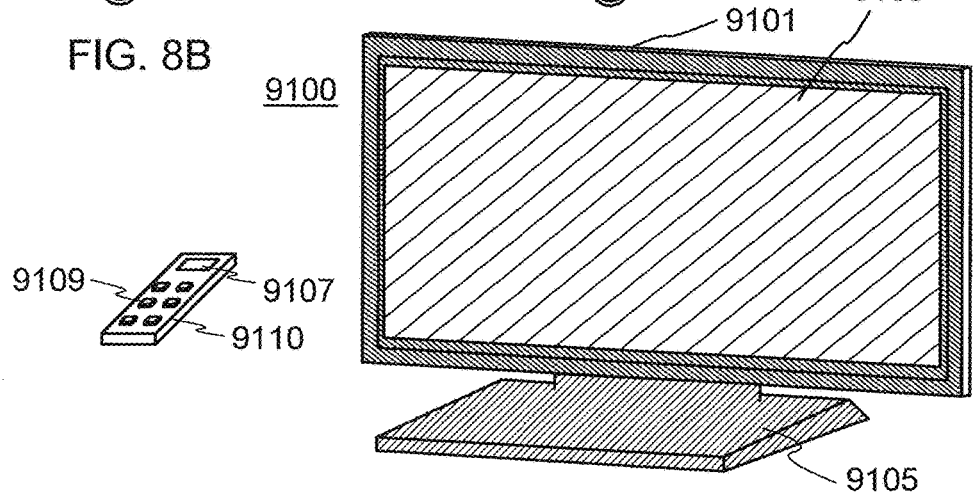

FIG. 8B illustrates a television set 9100. In the television set 9100, a display portion 9103 is incorporated in a housing 9101. A semiconductor device manufactured using one embodiment of the present invention can be used in the display portion 9103, so that an image can be displayed on the display portion 9103. Note that the housing 9101 is supported by a stand 9105 here.

The television set 9100 can be operated with an operation switch of the housing 9101 or a separate remote controller 9110. Channels and volume can be controlled with an operation key 9109 of the remote controller 9110 so that an image displayed on the display portion 9103 can be controlled. Furthermore, the remote controller 9110 may be provided with a display portion 9107 for displaying data output from the remote controller 9110.

The television set 9100 illustrated in FIG. 8B is provided with a receiver, a modem, and the like. With the receiver, the television set 9100 can receive a general television broadcast. Further, when the television set 9100 is connected to a communication network with or without wires connection via the modem, one-way (from a transmitter to a receiver) or two-way (between a transmitter and a receiver or between receivers) data communication can be performed.

When the semiconductor device including a buried channel described in the above embodiment is used for the display portion 9103 of the television set, the television set can have higher display quality than a conventional one.

Figure 8C:
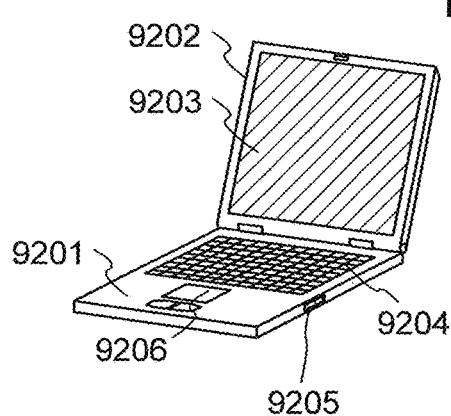

FIG. 8C illustrates a computer which includes a main body 9201, a housing 9202, a display portion 9203, a keyboard 9204, an external connection port 9205, a pointing device 9206, and the like. The computer includes a semiconductor device manufactured according to one embodiment of the present invention for the display portion 9203.

Further, when the semiconductor device described in the above embodiment is used for the display portion 9203 of the computer, the display portion can have higher display quality than a conventional one.

Figure 8D:
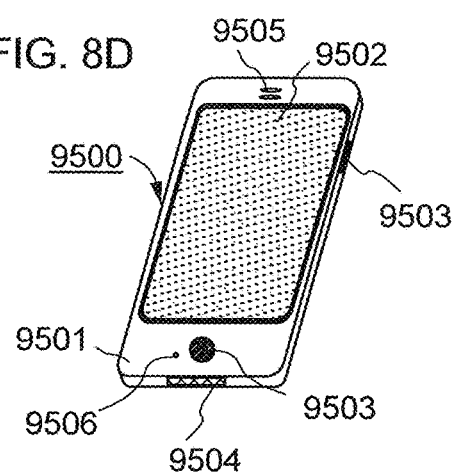

FIG. 8D illustrates an example of a mobile phone. A mobile phone 9500 is provided with a display portion 9502 incorporated in a housing 9501, an operation button 9503, an external connection port 9504, a speaker 9505, a microphone 9506, and the like. Note that the mobile phone 9500 is manufactured using a semiconductor device manufactured using one embodiment of the present invention for the display portion 9502.

Users can input data, make a call, or text a message by touching the display portion 9502 of the mobile phone 9500 illustrated in FIG. 8D with their fingers or the like.

There are mainly three screen modes for the display portion 9502. The first mode is a display mode mainly for displaying images. The second mode is an input mode mainly for inputting data such as text. The third mode is the one in which two modes of the display mode and the input mode are combined.

For example, in the case of making a call or text messaging, a text input mode mainly for inputting text is selected for the display portion 9502 so that characters displayed on a screen can be input. In this case, it is preferable to display a keyboard or number buttons on almost the entire screen of the display portion 9502.

By providing a detection device which includes a sensor for detecting inclination, such as a gyroscope or an acceleration sensor, inside the mobile phone 9500, the direction of the mobile phone 9500 (whether the mobile phone 9500 is placed horizontally or vertically for a landscape mode or a portrait mode) is determined so that display on the screen of the display portion 9502 can be automatically switched.

In addition, the screen mode is switched by touching the display portion 9502 or operating the operation button 9503 of the housing 9501. Alternatively, the screen modes can be switched depending on kinds of images displayed in the display portion 9502. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 9502 is not performed within a specified period of time while a signal detected by an optical sensor in the display portion 9502 is detected, the screen mode may be controlled so as to be switched from the input mode to the display mode.

The display portion 9502 can also function as an image sensor. For example, an image of a palm print, a fingerprint, or the like is taken by touching the display portion 9502 with the palm or the finger, whereby personal authentication can be performed. Further, by providing a backlight or a sensing light source which emits a near-infrared light in the display portion, an image of a finger vein, a palm vein, or the like can be taken.

When the semiconductor device described in the above embodiments is employed, color mixing, color shift, or the like in display does not easily occur. Therefore, with use of the semiconductor device for the display portion 9502 of the mobile phone, the mobile phone can have higher display quality than a conventional one. In addition, the pair of substrates is supported by the light-blocking spacer, so that the semiconductor device is extremely resistant to external force such as impact, distortion, or the like. Thus, the semiconductor device can be favorably used for the mobile phone illustrated in FIG. 8D.

The methods and structures described in this embodiment can be combined as appropriate with any of the methods and structures described in the other embodiments.

Example 1

In this example, samples including a first oxide semiconductor layer, a second oxide semiconductor layer with a smaller energy gap than the first oxide semiconductor layer, and a third oxide semiconductor layer, which are stacked in this order, was manufactured; ionization potential of the sample were measured; and the energy band was calculated based on the result and an energy bad diagram was obtained. In this specification, the value of the ionization potential corresponds to the sum of the band gap and the electron affinity, and the value of the band gap is a value obtained by measuring a single material film with an ellipsometer.

As Sample 1, a 5-nm-thick IGZO film, a 5-nm-thick In—Sn—Zn-based oxide film, and a 5-nm-thick IGZO film were stacked over a single crystal silicon substrate. These films were deposited by a sputtering method at a substrate temperature of 300° C. in an oxygen atmosphere (the proportion of oxygen is 100%). An oxide target having a composition ratio, In:Ga:Zn=1:1:1 [atomic ratio] was used as the target to form the IGZO film. Further, an oxide target having a composition ratio, In:Sn:Zn=2:1:3 [atomic ratio] was used for the In—Sn—Zn-based oxide film.

Figure 11A:
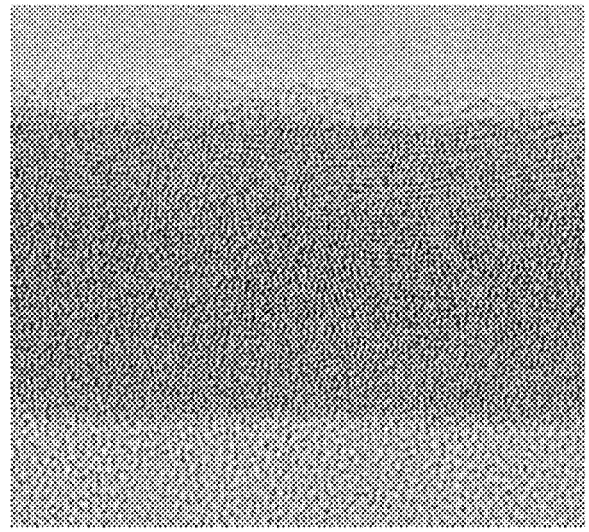
FIGS. 11A and 11B are a TEM image of Sample and a schematic diagram thereof.
Figure 11B:
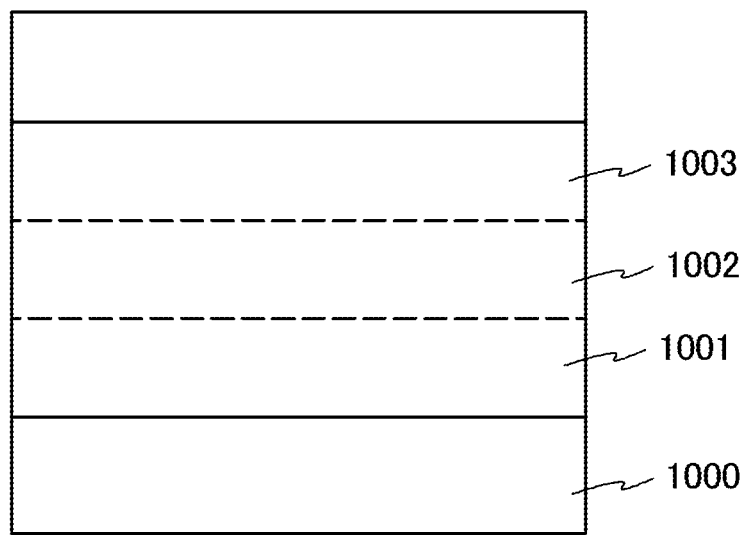

FIG. 11A is a TEM image of a cross-section of Sample 2 obtained by stacking a 5-nm-thick first IGZO film 1001, a 5-nm-thick In—Sn—Zn-based oxide film 1002, and a 5-nm-thick second IGZO film 1003 to be stacked over a quartz substrate 1000 under the same deposition conditions as the above, with the use of a quartz substrate. Note that a schematic view thereof is illustrated in FIG. 11B. In FIG. 11B, interfaces between the oxide semiconductor layers are schematically denoted by a dotted line. In some cases, the interfaces between the oxide semiconductor layers are unclear depending on the material, the deposition conditions, or heat treatment. The interfaces between the IGZO films and the In—Sn—Zn-based oxide film can be observed in Sample 2 shown in FIG. 11A. Further, from FIG. 11A, crystals can be observed in the second IGZO film 1003 and the In—Sn—Zn-based oxide film 1002, and the second IGZO film 1003 and the In—Sn—Zn-based oxide film 1002 are a c-axis aligned crystal oxide semiconductor (CAAC-OS) film. In addition, from FIG. 11A, the first IGZO film 1001 has an amorphous structure. Note that in FIG. 11A, two out of the three layers are oxide semiconductor films having a crystalline structure; however, the structure of the oxide semiconductor stack is not limited thereto. Only the second IGZO film 1003 may have a crystalline structure, or all of the three layers may have an amorphous structure.

Ionization potential was measured by ultraviolet photoelectron spectroscopy (UPS) while Sample 1 was sputtered from a surface side of Sample 1. The measurement result is shown in FIG. 9.

Figure 9:
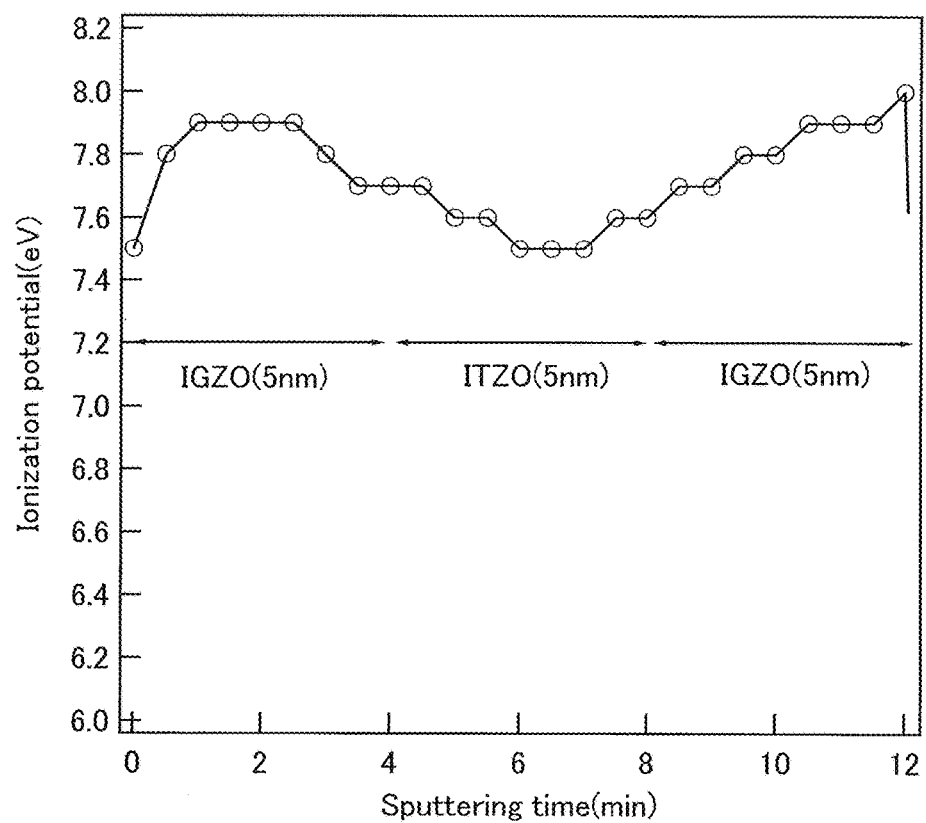
FIG. 9 is a graph showing the ionization potential.

In FIG. 9, the horizontal axis indicates the time of sputtering conducted from the surface side of Sample 1 and the vertical axis indicates the ionization potential. Borders between the films are indicated on the assumption that the sputtering rate of the IGZO film is equal to that of the In—Sn—Zn-based oxide film. From FIG. 9, the ionization potential of the In—Sn—Zn-based oxide film which was sandwiched between the IGZO films is lowered. Note that ionization potential corresponds to energy difference between a vacuum level and valence band.

Figure 10:
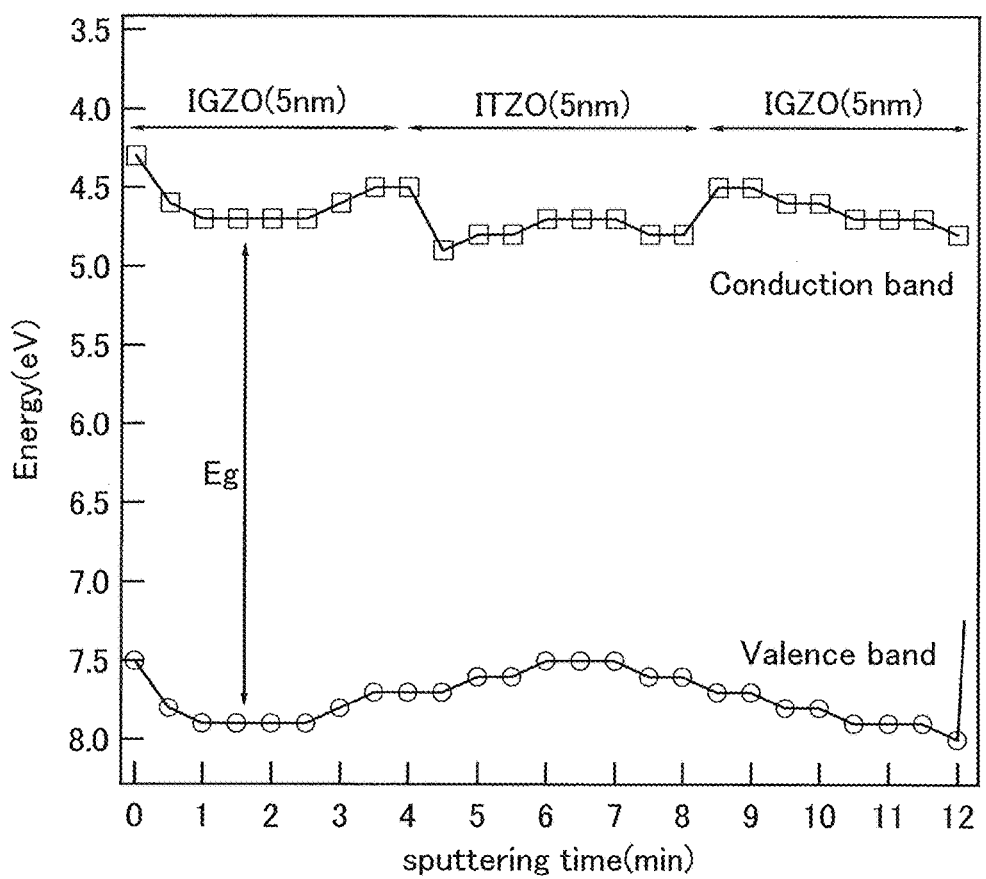
FIG. 10 is an energy band diagram.

The energy of the conduction band was obtained by subtracting the band gap measured by an ellipsometer from the value of the ionization potential, and the band structure of the stacked films was formed. Note that the band gap of the IGZO film was 3.2 eV, and the band gap of the In—Sn—Zn-based oxide film was 2.8 eV. FIG. 10 shows the result. FIG. 10 indicates that a buried channel is formed as in the case of the energy band diagram of FIG. 1D.

According to this example, as an energy band diagram, FIG. 10 or FIG. 1D can be applied to the stacked layer in which IGZO films are used for the first oxide semiconductor layer and the third oxide semiconductor layer, and an In—Sn—Zn-based oxide film is used for the second oxide semiconductor layer having higher ionization potential and smaller energy gap than the first oxide semiconductor layer and the third oxide semiconductor layer. The combination of materials of the first oxide semiconductor layer, the second oxide semiconductor layer, and the third oxide semiconductor layer are not particularly limited, and in consideration of energy gap of materials to be used, the materials may be appropriately selected and combined by practitioners in order to satisfy the energy band diagram shown in FIG. 10 or FIG. 1D. For example, a stacked structure in which IGZO films are used for the first oxide semiconductor layer and the third oxide semiconductor layer and an IZO film is used for the second oxide semiconductor layer may be used.

EXPLANATION OF REFERENCE

101: oxide semiconductor layer, 102: oxide semiconductor layer, 103: oxide semiconductor layer, 111: oxygen-excess region, 112: oxygen-excess region, 113: oxygen-excess region, 121a: first low-resistance region, 121b: first low-resistance region, 121c: channel formation region, 121d: first region, 121e: first region, 122a: second low-resistance region, 122b: second low-resistance region, 122c: channel formation region, 122d: second region, 122e: second region, 123a: third low-resistance region, 123b: third low-resistance region, 123c: channel formation region, 123d: third region, 123e: third region, 131d: first region, 131e: first region, 132d: second region, 132e: second region, 133d: third region, 400: substrate, 401: gate electrode layer, 402: gate insulating film, 403: oxide semiconductor stack, 405a: source electrode layer, 405b: drain electrode layer, 405c: source electrode layer, 405d: drain electrode layer, 407: insulating film, 421: dopant, 431: oxygen, 436: oxide insulating film, 442: gate insulating film, 465a: wiring layer, 465b: wiring layer, 510: transistor, 520: transistor, 530: transistor, 540: transistor, 550: transistor, 560: transistor, 570: transistor, 601: substrate, 602: photodiode, 606a: semiconductor film, 606b: semiconductor film, 606c: semiconductor film, 608: adhesive layer, 613: substrate, 631: insulating film, 632: insulating film, 633: interlayer insulating film, 634: interlayer insulating film, 640: transistor, 641: electrode layer, 642: electrode layer, 643: conductive layer, 645: conductive layer, 656: transistor, 658: photodiode reset signal line, 659: gate signal line, 671: photo sensor output signal line, 672: photo sensor reference signal line, 1000: quartz substrate, 1001: first IGZO film, 1002: In—Sn—Zn-based oxide film, 1003: second IGZO film, 4001: substrate, 4002: pixel portion, 4003: signal line driver circuit, 4004: scan line driver circuit, 4005: sealant, 4006: substrate, 4008: liquid crystal layer, 4010: transistor, 4011: transistor, 4013: liquid crystal element, 4015: connection terminal electrode, 4016: terminal electrode, 4018: FPC, 4019: anisotropic conductive film, 4020: insulating film, 4021: insulating film, 4023: insulating film, 4030: electrode layer, 4031: electrode layer, 4032: insulating film, 4040: transistor, 4510: partition wall, 4511: electroluminescent layer, 4513: light-emitting element, 4514: filler, 9000: table, 9001: housing, 9002: leg portion, 9003: display portion, 9004: displayed button, 9005: power cord, 9100: television set, 9101: housing, 9103: display portion, 9105: stand, 9107: display portion, 9109: operation key, 9110: separate remote controller, 9201: main body, 9202: housing, 9203: display portion, 9204: keyboard, 9205: external connection port, 9206: pointing device, 9500: mobile phone, 9501: housing, 9502: display portion, 9503: operation button, 9504: external connection port, 9505: speaker, 9506: microphone This application is based on Japanese Patent Application Serial No. 2011-135365 filed with Japan Patent Office on Jun. 17, 2011, the entire contents of which are hereby incorporated by reference.

The invention claimed is:
1. A semiconductor device comprising:
   an oxide semiconductor stack including a first oxide semiconductor layer, a second oxide semiconductor layer in contact with a top surface of the first oxide semiconductor layer, and a third oxide semiconductor layer in contact with a top surface of the second oxide semiconductor layer;
   a source electrode layer and a drain electrode layer adjacent to the oxide semiconductor stack;
   a gate insulating film adjacent to the oxide semiconductor stack; and
   a gate electrode layer adjacent to the oxide semiconductor stack with the gate insulating film interposed therebetween, wherein, in the oxide semiconductor stack, a region which does not overlap the source electrode layer or the drain electrode layer has a higher oxygen concentration than a region which overlaps the source electrode layer or the drain electrode layer, and wherein the third oxide semiconductor layer covers side surfaces of the second oxide semiconductor layer and the first oxide semiconductor layer in a channel width direction.

2. The semiconductor device according to claim 1, wherein each of the first oxide semiconductor layer and the third oxide semiconductor layer contains indium, gallium and zinc, and the second oxide semiconductor layer contains indium, tin and zinc.

3. The semiconductor device according to claim 1, wherein an electron affinity of the second oxide semiconductor layer is higher than electron affinities of the first oxide semiconductor layer and the third oxide semiconductor layer.

4. The semiconductor device according to claim 1, wherein a region which is in the oxide semiconductor stack and does not overlap with the gate electrode layer contains dopant.

5. The semiconductor device according to claim 1, wherein the oxide semiconductor stack is a c-axis aligned crystal oxide semiconductor film.

6. The semiconductor device according to claim 1, wherein the semiconductor device is one selected from the group consisting of a table having a display portion, a television set, a computer, and a mobile phone.

7. A semiconductor device comprising:
an oxide semiconductor stack including a first oxide semiconductor layer, a second oxide semiconductor layer in contact with a top surface of the first oxide semiconductor layer, and a third oxide semiconductor layer in contact with a top surface of the second oxide semiconductor layer;
a source electrode layer and a drain electrode layer adjacent to the oxide semiconductor stack;
a gate insulating film over the oxide semiconductor stack; and
a gate electrode layer over the oxide semiconductor stack with the gate insulating film interposed therebetween,
wherein, in the oxide semiconductor stack, a region which does not overlap the source electrode layer or the drain electrode layer has a higher oxygen concentration than a region which overlaps the source electrode layer or the drain electrode layer, and
wherein the third oxide semiconductor layer covers side surfaces of the second oxide semiconductor layer and the first oxide semiconductor layer in a channel width direction.

8. The semiconductor device according to claim 7, wherein each of the first oxide semiconductor layer and the third oxide semiconductor layer contains indium, gallium and zinc, and the second oxide semiconductor layer contains indium, tin and zinc.

9. The semiconductor device according to claim 7, wherein an electron affinity of the second oxide semiconductor layer is higher than electron affinities of the first oxide semiconductor layer and the third oxide semiconductor layer.

10. The semiconductor device according to claim 7, wherein a region which is in the oxide semiconductor stack and does not overlap with the gate electrode layer contains dopant.

11. The semiconductor device according to claim 7, wherein the oxide semiconductor stack is a c-axis aligned crystal oxide semiconductor film.

12. The semiconductor device according to claim 7, wherein the semiconductor device is one selected from the group consisting of a table having a display portion, a television set, a computer, and a mobile phone.

* * * * *